(12) United States Patent
Lee et al.

(10) Patent No.: US 11,462,989 B2
(45) Date of Patent: Oct. 4, 2022

(54) POWER CONVERTING APPARATUS, AND VEHICLE INCLUDING THE SAME

(71) Applicant: LG ELECTRONICS INC., Seoul (KR)

(72) Inventors: Jonggyu Lee, Seoul (KR); Taejin Kim, Seoul (KR); Hyosung Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 111 days.

(21) Appl. No.: 16/952,456

(22) Filed: Nov. 19, 2020

(65) Prior Publication Data

US 2021/0159772 A1 May 27, 2021

(30) Foreign Application Priority Data

Nov. 22, 2019 (KR) .................. 10-2019-0151458

(51) Int. Cl.
*H02M 1/08* (2006.01)
*H02M 7/5387* (2007.01)
(Continued)

(52) U.S. Cl.
CPC .......... *H02M 1/08* (2013.01); *H02M 7/53871* (2013.01); *H02P 27/08* (2013.01); *H02M 1/0054* (2021.05)

(58) Field of Classification Search
CPC .......... H02M 1/08; H02M 2001/0054; H02M 7/5387; H02M 5/00; H02M 5/32;
(Continued)

(56) References Cited

U.S. PATENT DOCUMENTS 9,438,228 B2 9/2016 Peng et al.
10,199,916 B2 * 2/2019 Snook .................. H03K 17/168
(Continued)

FOREIGN PATENT DOCUMENTS

CN     109842279 A    6/2019
WO     2013138219 A1  9/2013

OTHER PUBLICATIONS

Yaxiu Sun et al., "A Novel Three Stage Drive Circuit for IGBT", Singapore, May 24-26, 2006, IEEE Service Center, May 1, 2006, pp. 1-6, XP031026664.

*Primary Examiner* — Antony M Paul
(74) *Attorney, Agent, or Firm* — Dentons US LLP

(57) ABSTRACT

A power converting apparatus and a vehicle including the same according to an embodiment of the present disclosure includes a switching element; and a gate drive unit configured to apply a gate driving signal for driving the switching element to a gate terminal of the switching element, wherein the gate drive unit includes: a current source unit including a source current for sourcing current to the gate terminal in a turn-on section of the switching element, and a sink current for sinking current from the gate terminal in a turn-off section of the switching element; a control current for sinking the current from the gate terminal during a partial section of the turn-on section and the turn-off section of the switching element; and a control current controller configured to control an operation of the control current.

20 Claims, 16 Drawing Sheets

(51) Int. Cl.
*H02P 27/08* (2006.01)
*H02M 1/00* (2006.01)

(58) Field of Classification Search
CPC ........ H02M 7/42; H02M 7/483; H02M 7/487;
H02M 7/515; H02M 2001/0029; H02M
2001/0048; H02M 2001/0087; H02M
2007/5387; H02P 27/08; H02P 2201/00;
H02P 2209/09; H02P 27/00; H02P 27/04;
H02P 27/06; H02P 27/085; H02P 27/14;
H02P 21/00; H02P 21/0003; H02P
21/142016; H02P 23/00; H02P 21/22;
H02P 21/30; H02P 23/14; H02P 4/00;
H02P 1/00; H02P 1/04; H02P 1/24; H02P
1/26; H02P 1/42; H02P 1/46; H02P 1/465
See application file for complete search history.

(56) References Cited

U.S. PATENT DOCUMENTS

2001/0040470 A1  11/2001  Brando et al.
2013/0107584 A1   5/2013  Li et al.

\* cited by examiner (a)

(b)

POWER CONVERTING APPARATUS, AND VEHICLE INCLUDING THE SAME

This application is filed under 35 USC § 119, and claims the benefit of KR Application No. 10-2019-0151458, filed Nov. 22, 2019, the contents of which are all hereby incorporated by reference herein in their entirety.

BACKGROUND OF THE INVENTION

1. Field of the Invention

The present disclosure relates to a power converting apparatus, and a vehicle including the same, and more particularly, to a power converting apparatus capable of reducing switching loss, and a vehicle including the same.

2. Description of the Related Art

Electric vehicles powered by electricity, hybrid vehicles integrating an internal combustion engine with an electric vehicle, and the like generate their output by using a motor and a battery.

Meanwhile, in order to drive the motor, a power converting apparatus, which is a device that converts input power and supplies the converted power, is required.

Meanwhile, the power converting apparatus may include a switching element. For example, an inverter, or the like provided in the power converting apparatus may include various semiconductor devices. For example, insulated gate bipolar transistor (IGBT), metal-oxide semiconductor field-effect transistors (MOSFET), and the like are widely used as a switching element.

FIG. 16 illustrates a conventional insulated gate bipolar transistor (IGBT) driving circuit.

Referring to FIG. 16, according to an input control signal (e.g. a PWM signal), a gate driver IC 46 may supply a constant voltage to an IGBT switch to turn on the IGBT switch. When a gate voltage of the IGBT switch exceeds the threshold voltage, the IGBT switch may be turned on. For example, when a 15V voltage greater than the threshold voltage is supplied from the gate driver IC 46, the IGBT switch may be turned on.

The power converting apparatus includes an inverter or the like having a switching element, and switching loss occurs when switching the switching element. For example, when a switching element such as a MOSFET or an IGBT is turned on/off, voltage/current crosses, and switching loss occurs.

As in the example of FIG. 16, a conventional voltage-type gate driver driving circuit for driving a switching element by supplying a voltage has a simple structure and excellent reliability.

However, in recent years, with the advent of Wide Band Gap (WBG) devices, the rated voltage and current capacity of the switch increases, and accordingly, the operating voltage and current required by a system is also increasing. In the case of using a conventional voltage-type gate driver, as the operating voltage and current increases, disadvantages in terms of element stress and switching loss are emerging.

Accordingly, research on a gate driver capable of reducing turn-on/off loss of a switching element and reducing element stress during switching is increasing.

As one of them, U.S. Pat. No. 9,438,228 suggests a gate driver for active control by adding a feedback circuit to a current source scheme. However, the U.S. Pat. No. 9,438,228, requires a lot of components, for example, a mirror circuit is provided for each of current sources that operate during turn-on/off, a current source for reducing a transient phenomenon during turn-on, a current source for reducing a transient phenomenon during turn-off, and a feedback circuit. Therefore, individual circuits for turn-on, turn-off, and feedback are applied respectively to increase the number of components. Due to this, the volume and cost are increased, and modularization and miniaturization are difficult. In addition, a parasitic inductance between the Kelvin source and the ground is used, but the size of the parasitic inductance is not constant.

SUMMARY OF THE INVENTION

The present disclosure has been made in view of the above problems, and provides a power converting apparatus capable of reducing switching loss and heat generation, and a vehicle including the same.

The present disclosure further provides a power converting apparatus capable of reducing element stress by limiting overvoltage and overcurrent that may occur during a switching operation, and a vehicle including the same.

The present disclosure further provides a low-cost, high-efficiency power converting apparatus using a small number of components, and a vehicle including the same.

The present disclosure further provides a power converting apparatus that is easily miniaturized and modularized by using a small number of components, and a vehicle including the same.

The present disclosure further provides a power converting apparatus capable of further improving switching efficiency through a switching operation according to a situation, and a vehicle including the same.

In order to achieve the above object, a power converting apparatus and a vehicle including the same according to an embodiment of the present disclosure may reduce the stress of a circuit element while reducing switching loss and heat generation, by using a control current that sinks current from a gate terminal during a partial section of a turn-on section and a turn-off section of sources of current connected to the gate terminal of the switching element and the switching element.

A power converting apparatus and a vehicle including the same according to an embodiment of the present disclosure include a control current for sinking current from the gate terminal during a partial section of a turn-on section and a turn-off section of a switching element, so that switching loss and heat generation can be reduced at low cost, and inverter and gate driver can be miniaturized and modularized.

In accordance with an aspect of the present disclosure, a power converting apparatus and a vehicle including the same include: a switching element; and a gate drive unit configured to apply a gate driving signal for driving the switching element to a gate terminal of the switching element, wherein the gate drive unit includes: a current source unit including a source current for sourcing current to the gate terminal in a turn-on section of the switching element, and a sink current for sinking current from the gate terminal in a turn-off section of the switching element; a control current for sinking the current from the gate terminal during a partial section of the turn-on section and the turn-off section of the switching element; and a control current controller configured to control an operation of the control current.

Meanwhile, the gate driving signal is generated by a combination of a current based on the current source unit and a current based on the control current.

Meanwhile, the turn-on section of the switching element comprises a first turn-on section in which two current paths are formed between the source current and the gate terminal and between the control current and the gate terminal, and a second turn-on section in which a current path is formed only between the source current and the gate terminal.

Meanwhile, the turn-off section of the switching element comprises a first turn-off section in which two current paths are formed between the control current and the gate terminal, and a second turn-off section in which a current path is formed only between the sink current and the gate terminal and between the sink current and the gate terminal.

Meanwhile, the gate driving signal is a gate current having at least two levels.

Meanwhile, when the switching element is turned on, the gate driving signal has a constant first current level due to the source current and the control current, and then has a second current level higher than the first current level while a current path of the control current is blocked.

Meanwhile, when the switching element is turned off, the gate driving signal has a constant third current level due to the sink current and the control current, and then has a fourth current level higher than the third current level while a current path of the control current is blocked.

Meanwhile, the power converting apparatus and the vehicle including the same further include: an inverter configured to output AC power to a motor; and an inverter controller configured to output an inverter switching control signal to the gate drive unit so as to control switching operation of the inverter, wherein the switching element is any one of a plurality of switching elements in the inverter.

Meanwhile, the power converting apparatus and the vehicle including the same further include a DC terminal capacitor configured to store a voltage of DC terminal which is an input terminal of the inverter; and a DC terminal voltage detector configured to detect the voltage of DC terminal, wherein an operation section of the control current is varied based on the detected voltage of DC terminal, so that switching efficiency can be further improved by switching operation suitable for a situation.

In this case, when the switching element is turned on, the control current operates longer when the detected voltage of DC terminal is greater than a preset reference voltage, than when the detected voltage of DC terminal is less than the preset reference voltage, and when the switching element is turned off, the control current operates shorter when the detected voltage of DC terminal is greater than a preset reference voltage, than when the detected voltage of DC terminal is less than the preset reference voltage.

Meanwhile, the control current controller includes a plurality of duty units, and any one of a plurality of duty units is selected based on the detected voltage of DC terminal.

In addition, the control current controller includes: a comparator configured to compare the detected voltage of DC terminal with the reference voltage; a turn-on duty unit configured to output a control signal to the control current, when the switching element is turned on; and a turn-off duty unit configured to output a control signal to the control current, when the switching element is turned off. Here, the turn-on duty unit and the turn-off duty unit include a switching element that is turned on to have a different time constant according to the detected voltage of DC terminal. In addition, the control current controller further includes an insulating unit which is disposed between the comparator, the turn-on duty unit and the turn-off duty unit.

Meanwhile, the source current and the sink current are a source of current having a constant current level magnitude, and the control current is a voltage controlled current source.

BRIEF DESCRIPTION OF THE DRAWINGS

The above and other objects, features and advantages of the present disclosure will be more apparent from the following detailed description in conjunction with the accompanying drawings, in which.

DETAILED DESCRIPTION OF THE PREFERRED EMBODIMENTS

Figure 1:
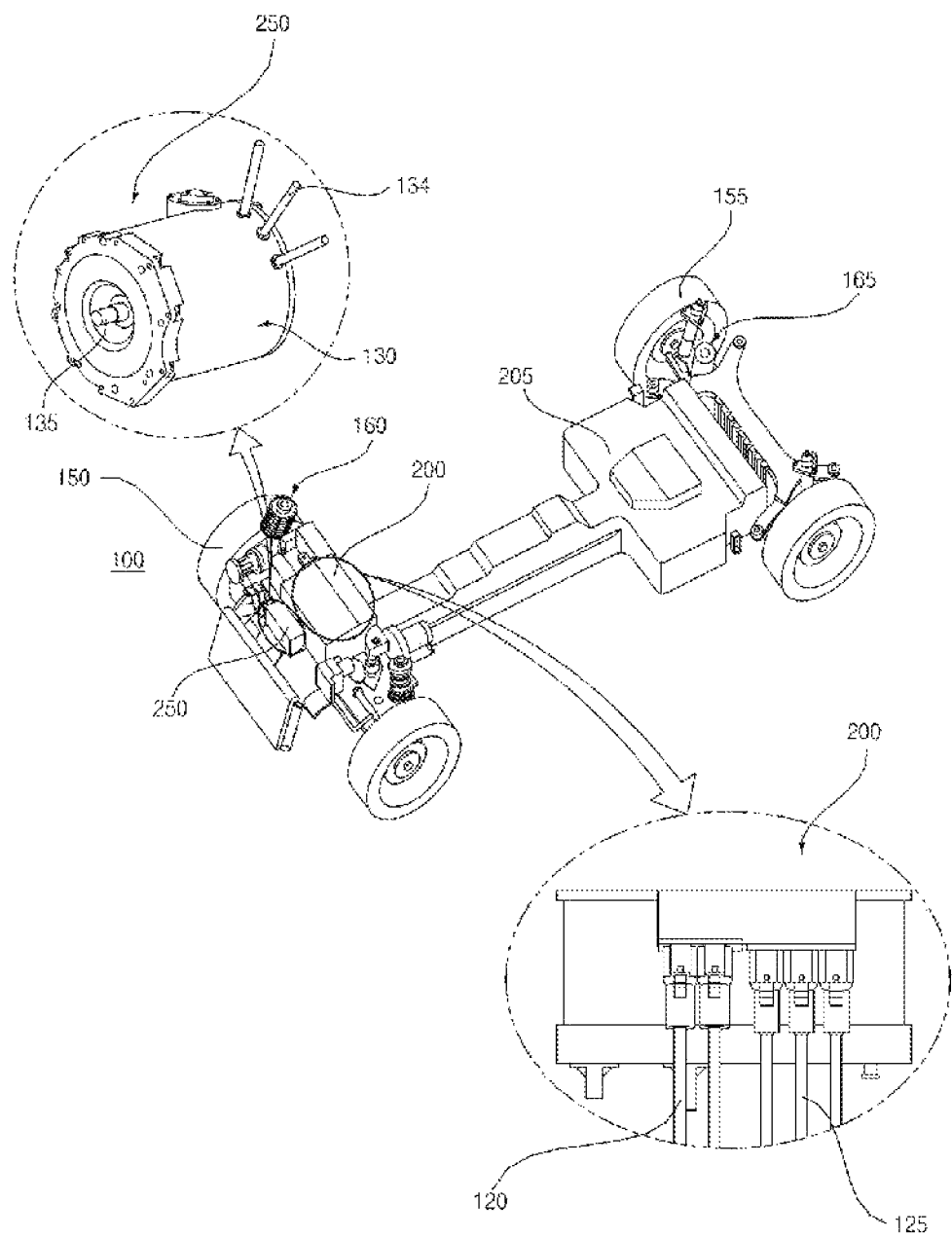
FIG. 1 is a schematic diagram illustrating a body of a vehicle according to an embodiment of the present disclosure.

Hereinafter, the present disclosure will be described in detail with reference to the accompanying drawings. In order to clearly and briefly describe the present disclosure, components that are irrelevant to the description will be omitted in the drawings. The same reference numerals are used throughout the drawings to designate the same or similar components. Terms "module" and "part" for elements used in the following description are given simply in view of the ease of the description, and do not carry any important meaning or role. Therefore, the "module" and the "part" may be used interchangeably. It will be understood that, although the terms "first", "second", etc. may be used herein to describe various elements, these elements should not be limited by these terms. These terms are only used to distinguish one element from another element.

FIG. 1 is a schematic diagram illustrating a body of a vehicle according to an embodiment of the present disclosure.

Referring to FIG. 1, a vehicle 100 according to an embodiment of the present disclosure may include a battery 205 that supplies power, a motor driving device 200 that receives power from the battery 205, a motor 250 that is driven and rotated by the motor driving device 200, a front wheel 150 and a rear wheel 155 rotated by the motor 250, and a front wheel suspension device 160 and a rear wheel suspension device 165 that block vibration due to a road surface from being transmitted to a vehicle body. Meanwhile, a driving gear (not shown) for converting the rotation speed of the motor 250 based on a gear ratio may be further provided.

The battery 205 supplies power to the motor driving device 200. In particular, DC power is supplied to a capacitor C in the motor driving device 200.

The battery 205 may be formed with a set of a plurality of unit cells. The plurality of unit cells may be managed by a battery management system (BMS) to maintain a constant voltage, and may emit a constant voltage by the battery management system.

For example, the battery management system may detect the voltage Vbat of the battery 205 and transmit it to an electronic controller (not shown) or an inverter controller 430 in the motor driving device 200, and may supply DC power stored in the capacitor C in the motor driving device 200 to the battery, when the battery voltage Vbat falls below a lower limit. In addition, when the battery voltage Vbat rises above an upper limit, the battery management system may supply DC power to the capacitor C in the motor driving device 200.

It is preferable that the battery 205 is composed of a secondary battery capable of charging and discharging, but is not limited thereto.

The motor driving device 200 receives DC power from the battery 205 through a power input cable 120. The motor driving device 200 converts DC power received from the battery 205 into AC power and supplies it to the motor 250. The AC power to be converted is preferably a three-phase AC power. The motor driving device 200 supplies three-phase AC power to the motor 250 through a three-phase output cable 125 provided in the motor driving device 200.

The motor driving device 200 of FIG. 1 illustrates the three-phase output cable 125 composed of three cables, but three cables may be provided in a single cable.

Meanwhile, a motor driving device 200 according to an embodiment of the present disclosure will be described later in FIG. 3 and below.

The motor 250 includes a stator 130 that is fixed without rotating, and a rotor 135 that rotates. The motor 250 is provided with an input cable 134 to receive AC power supplied from the motor driving device 200. The motor 250 may be, for example, a three-phase motor. In addition, when a voltage variable/frequency variable AC power of each phase is applied to a coil of the stator of each phase, the rotation speed of the rotor is variable, based on the applied frequency.

The motor 250 may be implemented in various forms, such as an induction motor, a blushless DC (BLDC) motor, a reluctance motor, and the like.

Meanwhile, a driving gear (not shown) may be provided in one side of the motor 250. The driving gear converts the rotational energy of the motor 250, based on a gear ratio. The rotational energy output from the driving gear is transmitted to a front wheel 150 and/or a rear wheel 155 so that the vehicle 100 moves.

The front wheel suspension device 160 and the rear wheel suspension device 165 support the front wheel 150 and the rear wheel 155 with respect to the vehicle body, respectively. The vertical direction of the front wheel suspension device 160 and the rear wheel suspension device 165 are supported by a spring or a damping mechanism, so that the vibration due to the road surface does not affect the vehicle body.

A steering device (not shown) may be further provided in the front wheel 150. The steering device is a device that adjusts the direction of the front wheel 150 to drive the vehicle 100 in a direction intended by a driver.

Meanwhile, although not shown in the drawing, the vehicle 100 may further include an electronic controller configured to control electronic devices throughout the vehicle. The electronic controller (not shown) controls each device to perform operation, display, and the like. In addition, it is also possible to control the above-described battery management system.

In addition, the electronic controller (not shown) may generate a running command value according to various running modes (traveling mode, reverse mode, neutral mode, parking mode, etc.), based on a detection signal from a tilt angle detector (not shown) configured to detect the tilt angle of the vehicle 100, a speed detector (not shown) configured to detect the speed of the vehicle 100, a brake detector (not shown) according to the operation of the brake pedal, and an accelerator detector (not shown) according to the operation of an accelerator pedal. The running command value at this time may be, for example, a torque command value.

Meanwhile, the vehicle 100 according to an embodiment of the present disclosure may include a hybrid electric vehicle using a battery and a motor while using an engine, as well as a pure electric vehicle using a battery and a motor. In this case, the hybrid electric vehicle may further include a switching means capable of selecting at least one of a battery and an engine, and a transmission. Meanwhile, the hybrid electric vehicle may be divided into a series type in which a motor is driven by converting mechanical energy output from an engine into electrical energy, and a parallel type in which mechanical energy output from the engine and an electric energy from a battery are simultaneously used.

Figure 2:
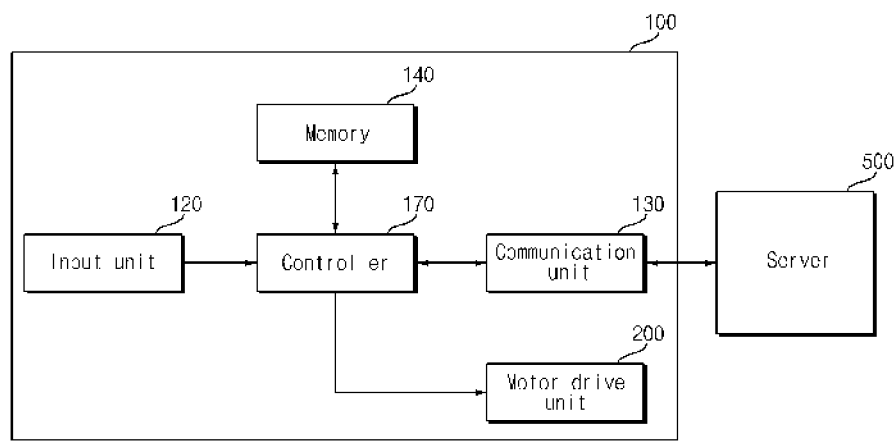
FIG. 2 is an example of a motor driving system according to an embodiment of the present disclosure.

FIG. 2 is an example of a motor driving system according to an embodiment of the present disclosure.

Referring to FIG. 2, the motor driving system 10 according to an embodiment of the present disclosure may include a vehicle 100 and a server 500.

Here, the server 500 may be a server operated by a manufacturer of the motor driving device 200 or the vehicle 100, or may correspond to the motor driving device 200 or a mobile terminal of a driver of the vehicle 100.

Meanwhile, the vehicle 100 may include an input unit 120, a communication unit 130, a memory 140, a controller 170, and a motor drive unit 200.

The input unit 120 includes an operation button, a key, and the like, and may output an input signal for power on/off of the vehicle 100, operation setting, and the like.

The communication unit 130 may exchange data with a peripheral device, e.g., the server 500, by wire or wirelessly, or exchange data wirelessly with a server in a remote location. For example, mobile communication such as 4G or 5G, infrared IR communication, RF communication, Bluetooth communication, ZigBee communication, WiFi communication, and the like may be performed.

Meanwhile, the memory 140 of the vehicle 100 may store data necessary for the operation of the vehicle 100. For example, it is possible to store data on an operation time, an operation mode, and the like during operation of the drive unit 200.

In addition, the memory 140 of the vehicle 100 may store management data including power consumption information of the vehicle, recommended running information, current running information, and management information.

In addition, the memory 140 of the vehicle 100 may store diagnostic data including vehicle operation information, running information, and error information.

The controller 170 may control each unit in the vehicle 100. For example, the controller 170 may control the input unit 120, the communication unit 130, the memory 140, the drive unit 200, and the like.

The motor drive unit 200 may be referred to as a motor driving device, in order to drive the motor 250 as a drive unit.

The motor driving device 200 according to an embodiment of the present disclosure may include an inverter 420 that has a plurality of switching elements and outputs AC power to the motor 250, an output current detection unit E configured to detect the output current io flowing through the motor 250, and an inverter controller 430 that outputs a switching control signal to the inverter 420, based on a torque command value T* and current information (id, iq) based on the output current io detected by the output current detection unit E.

Meanwhile, the torque command value T* and the current information (id, iq) based on the output current io may be transmitted to the external server 500, and the current command value (i*d, i*q) may be received from the server 500. In addition, the inverter controller 430 may output a switching control signal to the inverter 420, based on the current command value received from the communication unit 130.

Accordingly, it is possible to drive the motor 250 based on the current command value corresponding to the maximum torque calculated in real time by the server 500. Accordingly, the maximum torque driving of the motor 250 can be achieved.

Meanwhile, the communication unit 130 in the motor driving device 200 according to an embodiment of the present disclosure may transmit the current information (id, iq), the torque command value T*, and voltage information relate to the detected DC terminal voltage Vdc to the server 500. Accordingly, it is possible to drive the maximum torque of the motor 250 under various conditions.

Meanwhile, a detailed operation of the motor driving device 200 will be described with reference to FIG. 3.

Figure 3:
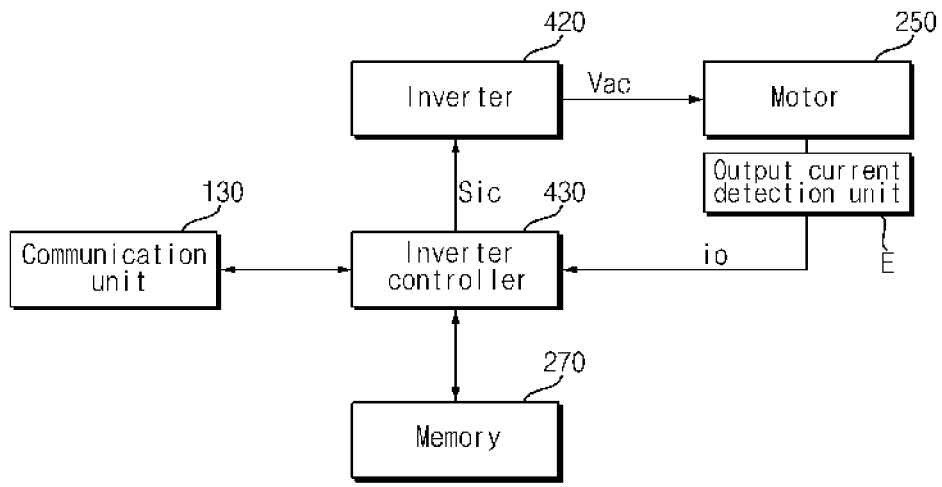
FIG. 3 illustrates an example of an internal block diagram of a motor driving device of FIG. 2.

FIG. 3 illustrates an example of an internal block diagram of a motor driving device of FIG. 2.

Referring to FIG. 3, the motor driving device 200 according to an embodiment of the present disclosure has a plurality of switching elements (Sa~Sc, S'a~S'c), as a driving device for driving the motor 250, and may include an inverter 420 that outputs AC power to the motor 250 and an inverter controller 430 that controls the inverter 420. In addition, the motor driving device 200 may include a memory 270 that provides various stored data to the inverter controller 430.

Meanwhile, the motor driving device 200 according to an embodiment of the present disclosure may further include a capacitor C that stores a voltage Vdc of the DC terminal which is an input terminal of the inverter 420, a DC terminal voltage detector B configured to detect the voltage Vdc of the DC terminal, and an output current detection unit E that detects the output current flowing through the motor 250.

According to an embodiment of the present disclosure, the motor 250 may be a three-phase motor driven by the inverter 420.

Meanwhile, the inverter controller 430 may output a switching control signal Sic to the inverter 420, based on the current command values (i*d, i*q) corresponding to the calculated maximum torque. Accordingly, the maximum torque driving of the motor 250 can be achieved.

The inverter controller 430 according to an embodiment of the present disclosure calculates the current information (id, iq) and the torque command value T* in real time, calculates the current command value (i*d, i*q), based on the torque command value T*, and drives the motor 250 by using the current command values (i*d, i*q).

Accordingly, the accuracy for high-efficiency driving is improved.

Meanwhile, the motor driving device 200 may further include a capacitor C that stores the voltage Vdc of the DC terminal which is an input terminal of the inverter 420, and a DC terminal voltage detector B that detects the voltage Vdc of the DC terminal.

The inverter controller 430 calculates a current command value (i*d, i*q), based on current information (id, iq), the torque command value T*, and the detected DC terminal voltage Vdc, and drives the motor 250 by using the current command values (i*d, i*q). Accordingly, the accuracy for high-efficiency driving is improved.

Figure 4:
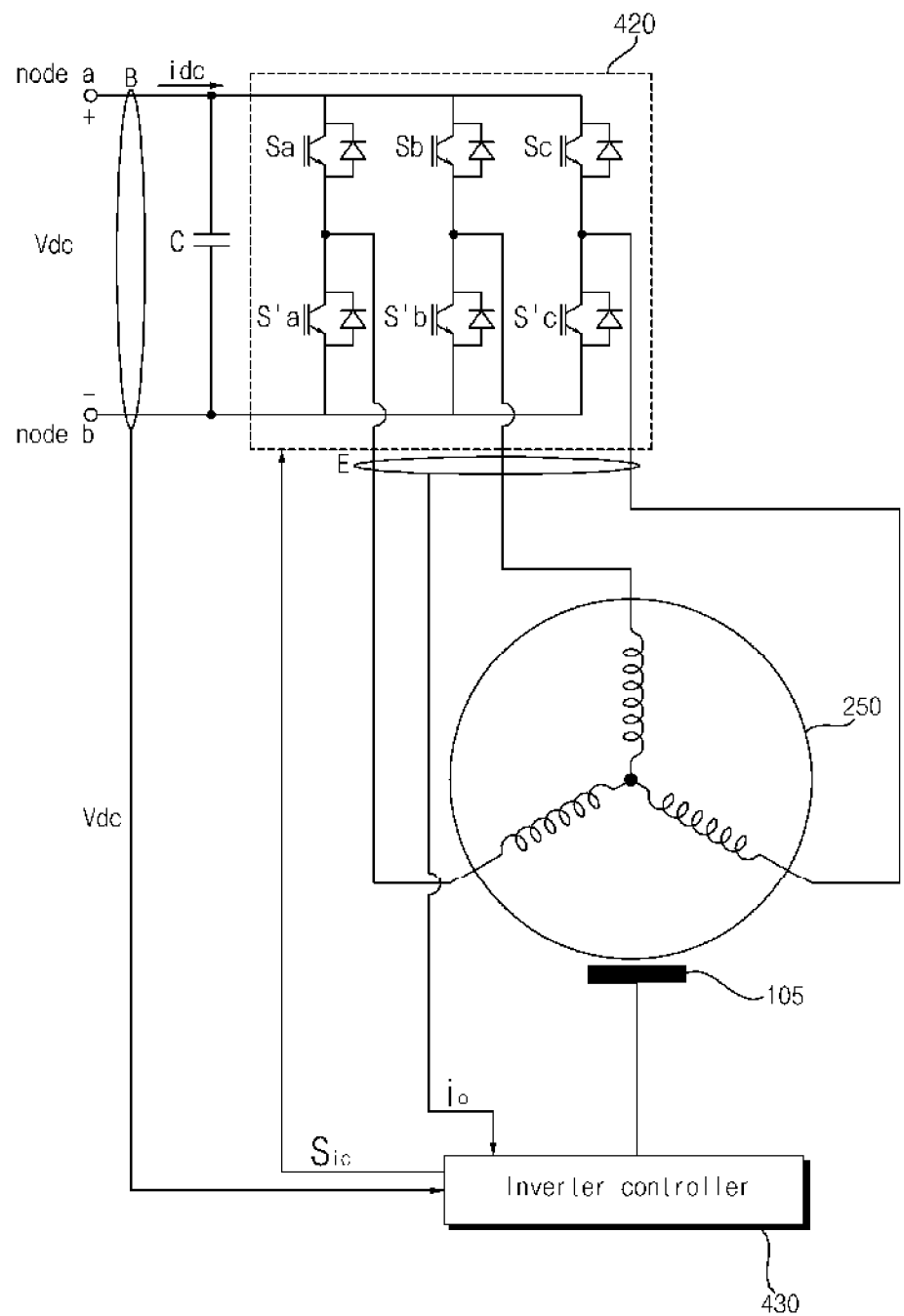
FIG. 4 is an example of an internal circuit diagram of the motor driving device of FIG. 3.

FIG. 4 is an example of an internal circuit diagram of the motor driving device of FIG. 3.

Referring to FIG. 4, the motor driving device 200 according to an embodiment of the present disclosure includes an inverter 420, an inverter controller 430, an output current detection unit E, a DC voltage detector Vdc, and a position detection sensor 105.

The DC terminal capacitor C stores an input power. In the drawing, a single device is illustrated as the DC terminal capacitor C, but a plurality of devices may be provided to ensure device stability.

Meanwhile, the input power supplied to the DC terminal capacitor C may be a power that is stored in the battery 205 or a power that is level-converted by a converter (not shown).

Meanwhile, since DC power is stored in both ends of the DC terminal capacitor C, both ends of the DC terminal capacitor C may be referred to as a DC terminal or a DC link terminal.

The DC terminal voltage detector B may detect the voltage Vdc of the DC terminal which is both ends of the DC terminal capacitor C. To this end, the DC terminal voltage detector B may include a resistance element, an amplifier, and the like. The detected DC terminal voltage Vdc may be input to the inverter controller 430 as a discrete signal in the form of a pulse.

The inverter 420 is provided with a plurality of inverter switching elements (Sa~Sc, S'a~S'c), and may convert the DC power Vdc into a three-phase AC power supply (Va, Vb, Vc) having a certain frequency by the on/off operation of the switching element (Sa~Sc, S'a~S'c) and output to the three-phase synchronous motor 250.

In the inverter 420, an upper arm switching element (Sa, Sb, Sc) and a lower arm switching element (S'a, S'b, S'c) which are connected in series to each other form a pair, and a total of three pairs of upper and lower arm switching elements are connected to each other in parallel (Sa&S'a, Sb&S'b, Sc&S'c). Diodes are connected in reverse parallel to each of the switching elements (Sa, S'a, Sb, S'b, Sc, and S'c).

The switching elements in the inverter 420 perform on/off operation of each of the switching elements based on an inverter switching control signal Sic from the inverter controller 430. Accordingly, three-phase AC power having a certain frequency is output to the three-phase synchronous motor 250.

The inverter controller 430 may control a switching operation of the inverter 420, based on a sensorless scheme.

To this end, the inverter controller 430 may receive an output current io detected by the output current detection unit E.

According to an embodiment, the inverter controller 430 may output an inverter switching control signal Sic to each gate terminal of the inverter 420, in order to control the switching operation of the inverter 420. Accordingly, the inverter switching control signal Sic may be referred to as a gate driving signal.

Meanwhile, the inverter switching control signal Sic is a switching control signal of a pulse width modulation method (PWM), and is generated and output based on the output current io detected by the output current detection unit E.

The output current detection unit E detects an output current io flowing between the inverter 420 and the three-phase motor 250. That is, the current flowing through the motor 250 may be detected.

The output current detection unit E may detect all of the output currents (ia, ib, ic) of each phase, or may detect the output current of two phase by using three-phase balance.

The output current detection unit E may be positioned between the inverter 420 and the motor 250, and for current detection, a current transformer (CT), a shunt resistor, or the like may be used.

The detected output current io is a discrete signal in the form of a pulse, and may be applied to the inverter controller 430, and a switching control signal Sic is generated based on the detected output current io.

Meanwhile, the three-phase motor 250 includes a stator and a rotor, and each phase AC power having a certain frequency is applied to the coil of the stator of each phase (a, b, c phase), so that the rotor rotates.

Such a motor 250 may include, for example, a surface-mounted permanent-magnet synchronous motor (SMPMSM), a interior permanent magnet synchronous motor (IPMSM), a synchronous reluctance motor (Synrm), or the like. Among them, SMPMSM and IPMSM are a permanent magnet synchronous motor (PMSM), and Synrm has no permanent magnet.

Meanwhile, the motor 250 according to an embodiment of the present disclosure is mainly described as an interior permanent magnet synchronous motor (IPMSM).

Figure 5:
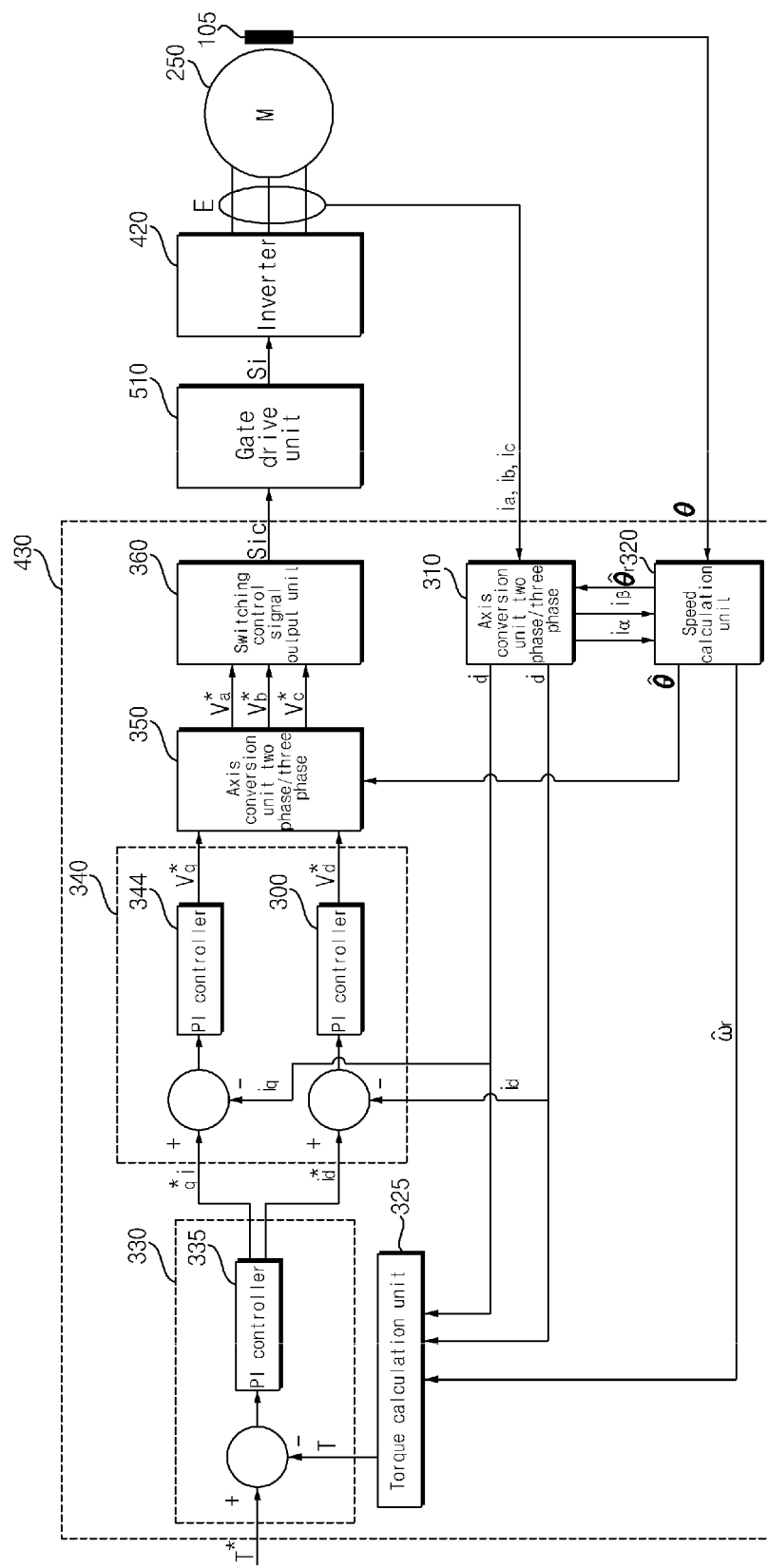
FIG. 5 is an example of an internal block diagram of an inverter controller of FIG. 4.

FIG. 5 is an example of an internal block diagram of an inverter controller of FIG. 4.

Referring to the drawing, the inverter controller 430 of FIG. 5 may receive the detected output current io from the output current detection unit E, and receive the rotor position information (θ) of the motor 250 from the position detection sensor 105.

The position detection sensor 105 may detect the magnetic pole position θ of the rotor of the motor 250. That is, the position detection sensor 105 may detect the position of the rotor of the motor 250.

To this end, the position detection sensor 105 may include an encoder, a resolver, or the like.

In the following description, a use coordinate system and a coordinate axis are defined here.

The αβ coordinate system is a two-dimensional fixed coordinate system having the fixed axes α and β as axes. The α and β axes are orthogonal to each other, and the β axis leads electrical angle 90° from the α axis.

The dq coordinate system is a two-dimensional rotational coordinate system having the d and q rotation axes as an axis. In a rotational coordinate system that rotates at the same speed as the rotational speed of the magnetic flux made by the permanent magnet of the motor 250, the axis according to the direction of the magnetic flux made by the permanent magnet is the d axis, and the axis that leads electrical angle 90° from the d axis is q axis.

Referring to FIG. 5, the inverter controller 430 may include a speed calculation unit 320, an axis conversion unit 310, a torque calculation unit 325, a current command generation unit 330, a voltage command generation unit 340, an axis conversion unit 350, a switching control signal output unit 360, and a gate drive unit 510.

The axis conversion unit 310 in the inverter controller 430 receives a three-phase output current (ia, ib, ic) detected by the output current detection unit E, and converts it into a two-phase current (iα, iβ) of the stationary coordinate system.

Meanwhile, the axis conversion unit 310 may convert the two-phase current (iα, iβ) of the stationary coordinate system into the two-phase current (id, iq) of the rotational coordinate system.

The speed calculation unit 320 in the inverter controller 430 estimates the rotor position $\hat{\theta}_y$ of the motor 250, based on the two-phase current (iα, iβ) of the stationary coordinate system converted by the axis conversion unit 310. In addition, the speed calculation unit 320 may output the calculated speed $\hat{\omega}_y$, based on the estimated rotor position $\hat{\theta}_y$.

The torque calculation unit 325 in the inverter controller 430 may calculate the current torque T, based on the calculated speed $\hat{\omega}_y$.

The current command generation unit 330 in the inverter controller 430 generates a current command value (i*d, i*q), based on the calculated current torque T and the torque command value T*.

For example, the current command generation unit 330 may perform PI control in the PI controller 335, based on the calculated current torque T and the torque command value T*, and generate a current command value (i*d, i*q). Meanwhile, the value of the d-axis current command value i*d may be set to 0.

Meanwhile, the current command generation unit 330 may further include a limiter (not shown) that limits the level of the current command value (i*d, i*q) so as not to exceed an allowable range.

Next, the voltage command generation unit 340 generates d-axis and q-axis voltage command value (V*d, V*q), based on the d-axis and q-axis current (id, iq) which is axially transformed from the axis conversion unit into a two-phase rotational coordinate system, and the current command value (i*d, i*q) in the current command generation unit 330 or the like.

For example, the voltage command generation unit 340 performs PI control in the PI controller 344, based on the difference between the q-axis current iq and the q-axis current command value i*q, and may generate the q-axis voltage command value V*q. In addition, the voltage command generation unit 340 performs PI control in the PI controller 348, based on the difference between the d-axis current id and the d-axis current command value i*d, and may generate the d-axis voltage command value V*d. Meanwhile, the value of the d-axis voltage command value V*d may be set to 0, in correspondence with the case where the value of the d-axis current command value i*d is set to 0.

Meanwhile, the voltage command generation unit 340 may further include a limiter (not shown) that limits the level of the d-axis and q-axis voltage command value V*d, V*q so as not to exceed the allowable range.

Meanwhile, the generated d-axis and q-axis voltage command value V*d, V*q is input to the axis conversion unit 350.

The axis conversion unit 350 receives the position $\hat{\theta}_y$ calculated by the speed calculation unit 320 and the d-axis and q-axis voltage command values V*d, V*q, and performs an axis conversion.

First, the axis conversion unit 350 converts from a two-phase rotational coordinate system to a two-phase stationary coordinate system. In this case, the position $\hat{\theta}_y$ calculated by the speed calculation unit 320 may be used.

In addition, the axis conversion unit 350 converts from a two-phase stationary coordinate system to a three-phase stationary coordinate system. Through such a conversion, the axis conversion unit 350 outputs a three-phase output voltage command value (V*a, V*b, V*c).

The switching control signal output unit 360 generates and outputs a switching control signal Sic according to a pulse width modulation (PWM) method based on a three-phase output voltage command value (V*a, V*b, V*c).

The output inverter switching control signal Sic may be output to, for example, the gate drive unit 510, and converted into a gate driving signal Si by the gate drive unit 510, and may be input to the gate of each switching element in the inverter 420. Accordingly, the switching elements (Sa, S'a, Sb, S'b, Sc, S'c) in the inverter 420 perform a switching operation.

The gate drive unit 510 may be connected to, for example, the inverter controller 430 and may receive an inverter switching control signal Sic from the inverter controller 430. The gate drive unit 510 may generate and output a gate driving signal Si for driving a plurality of switching elements provided in the inverter 420, for example, based on the inverter switching control signal Sic output from the inverter controller 430. The gate driving signal Si may be, for example, a control signal of a pulse width modulation method (PWM).

The gate drive unit 510 may include, for example, one or more gate drivers (not shown) that generate and output the gate driving signal Si. The plurality of gate drivers may respectively receive an inverter switching control signal Sic from, for example, the inverter controller 430.

The plurality of gate drives may respectively correspond to, for example, a plurality of switching elements provided in the inverter 420, and may output a gate driving signal Si for driving a corresponding switching element respectively, based on the inverter switching control signal Sic.

An embodiment of the present disclosure suggests a current source type active gate driver capable of reducing switching loss.

Hereinafter, a power converting apparatus for efficiently driving a switching element by controlling a gate current will be described.

Meanwhile, the power converting apparatus described below may be included in the motor driving device or correspond to the motor driving device.

Figure 6:
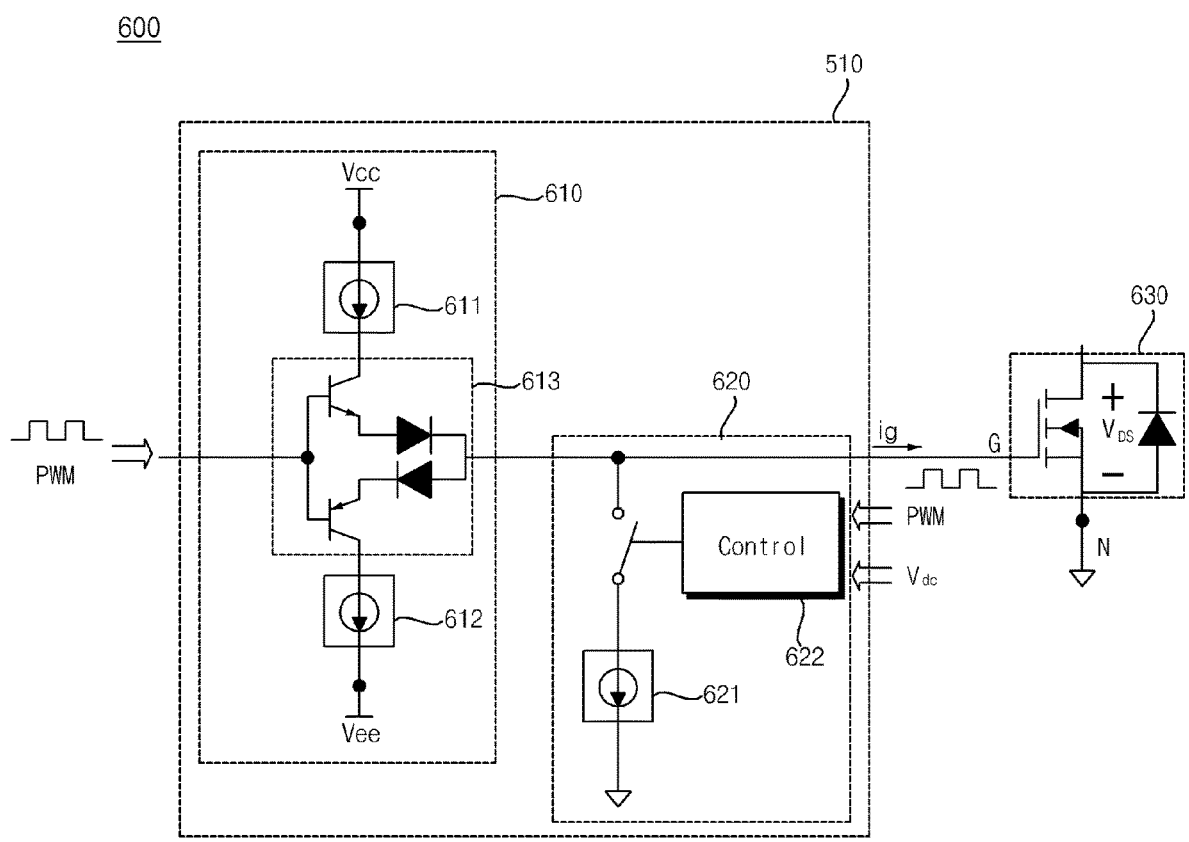
FIG. 6 is a block diagram illustrating a power converting apparatus according to an embodiment of the present disclosure.
Figure 7:
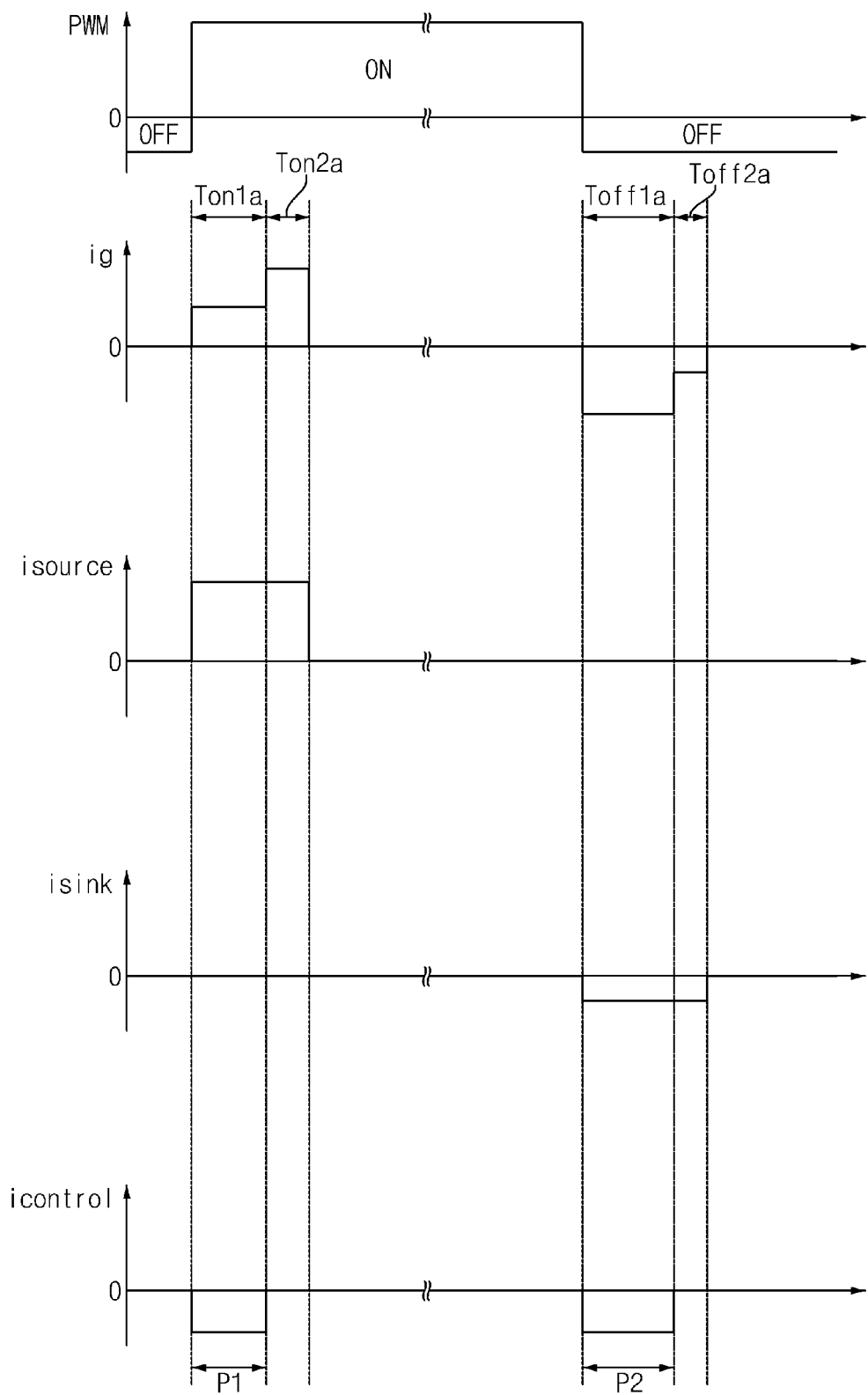
FIG. 7 is a diagram for explaining a gate driving signal of a power converting apparatus according to an embodiment of the present disclosure.
Figure 8:
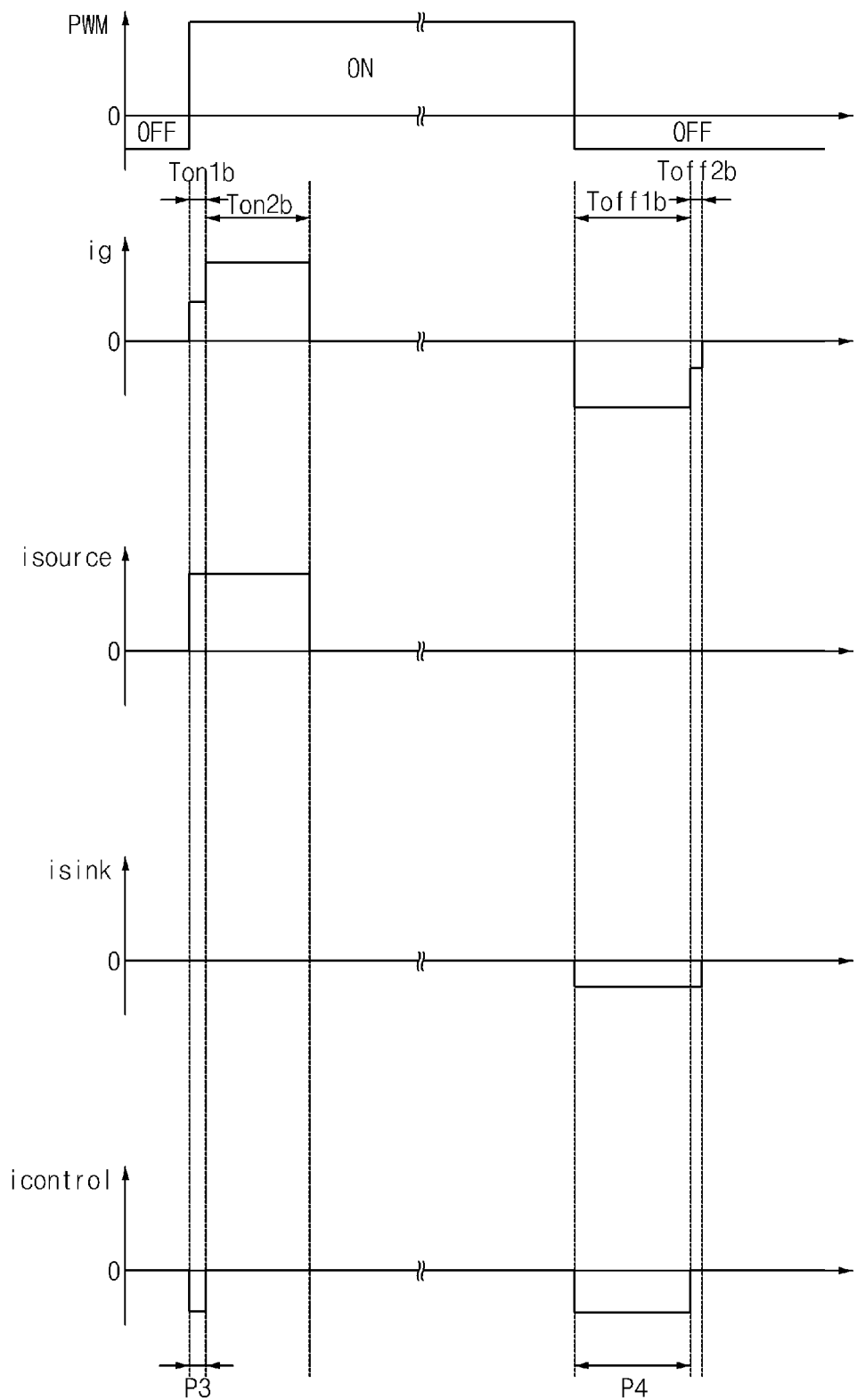
FIG. 8 is a diagram for explaining a gate driving signal of a power converting apparatus according to an embodiment of the present disclosure.

FIG. 6 is a block diagram illustrating a power converting apparatus according to an embodiment of the present disclosure, and FIGS. 7 and 8 are diagrams for explaining a gate driving signal of a power converting apparatus according to an embodiment of the present disclosure. In more detail, FIGS. 7 and 8 illustrate current waveforms generated by a circuit of FIG. 6.

Referring to FIG. 6, a power converting apparatus 600 according to an embodiment of the present disclosure may include a switching element 630, and a gate drive unit 510 configured to apply a gate driving signal for driving the switching element 630 to the gate terminal G of the switching element 630.

The gate drive unit 510 according to an embodiment of the present disclosure may include a current source unit 610 including a plurality of current sources 611 and 612, and a gate current controller 620 connected between the current source unit 610 and the gate terminal G and adjusting a gate current ig.

Referring to FIGS. 6 to 8, the current source unit 610 may include a source current 611 sourcing a current to the gate terminal G, in a turn-on section of the switching element 630, and a sink current 612 that sinks current from the gate terminal G, in a turn-off section of the switching element 630.

That is, the source current 611 may be a source of current when the switching device 630 is turned on, and the sink current 612 may be a source of current when the switching device 630 is turned off.

Meanwhile, the sourcing of current may mean charging the electric charge by supplying a current from the source of current to the gate terminal G, and the sinking of current may mean discharging the electric charge by subtracting the current from the gate terminal G side.

Meanwhile, the gate drive unit 510 may drive the switching element 630 according to the switching control signal Sic of pulse width modulation (PWM) method received from the inverter controller 430.

The current source unit 610 may include a connection unit 613 that operates according to the input switching control signal Sic of pulse width modulation (PWM) method, and forms a current path between the source current 611 and the gate terminal G, or forms a current path between the sink current 612 and the gate terminal G. Meanwhile, the connection unit 613 may further include a current limiting resistor (not shown) in the input side.

Meanwhile, the gate current controller 620 may adjust the level of the gate current ig input to the gate terminal G, by operating in a partial section of a turn-on section and a turn-off section. Further, the gate driving signal may be a gate current ig generated by a combination of a current (isource, isink) based on the current source unit 610 and a current (icontrol) based on a control current 621.

The gate current controller 620 according to an embodiment of the present disclosure may include a control current 621 for sinking the current from the gate terminal G, in a partial section of the turn-on section and the turn-off section of the switching element 630, and a control current controller 622 that controls the operation of the control current 621.

According to an embodiment of the present disclosure, a gate current ig is determined by combining currents based on a plurality of current sources 611, 612, 621, and the switching element 630 may be driven based on the gate current ig.

For example, the gate current ig may be generated by using the current sources 611 and 612 connected to the gate terminal G of the switching element 630, and the control current 621 that sinks the current from the gate terminal G in a partial section of the turn-on section and the turn-off section of the switching element 630.

Referring to FIG. 6, the source current 611 may operate in the turn-on section of the switching element 630, and the control current 621 may operate in a partial section of the turn-on section. Referring to FIGS. 7 and 8, in the turn-on section of the switching element 630, a gate current ig may be generated by the combination of the current (isource) due to the source current 611 and the current (icontrol) based on the control current 621.

Referring to FIG. 6, a sync current 612 may operate in the turn-off section of the switching element 630, and the control current 621 may operate in a partial section of the turn-off section. Referring to FIGS. 7 and 8, in the turn-off section of the switching element 630, a gate current ig may be generated by the combination of the current (isink) by the sink current 612 and the current (icontrol) based on the control current 621.

Accordingly, as illustrated in the waveforms of FIGS. 7 and 8, in the turn-on section and the turn-off section of the switching element 630, the gate current ig may have two levels that can be obtained when the gate current controller 620 operates and when the gate current controller 620 does not operate. In addition, the gate driving signal may be a gate current ig having at least two levels.

Referring to FIGS. 6 to 8, the turn-on section of the switching element 630 may include a first turn-on section (Ton1a, Ton1b) in which two current paths are formed between the source current 611 and the gate terminal G and between the control current 621 and the gate terminal G, and a second turn-on section (Ton2a, Ton2b) in which a current path is formed only between the source current 611 and the gate terminal G.

When the switching element 630 is turned on, the gate driving signal may have a constant first current level by the source current 611 and the control current 621, and then have a second current level higher than the first current level while the current path of the control current 621 is blocked.

That is, in the first turn-on section (Ton1a, Ton1b), the source current 611 and the control current 621 operate, and the current (isource) by the source current 611 and the current (icontrol) based on the control current 621 are summed.

Accordingly, the gate current ig in the first turn-on section (Ton1a, Ton1b) has a first level lower than the second turn-on section (Ton2a, Ton2b) in which the gate current ig is formed only by the current (isource) generated by the source current 611 having a constant current of a second level. Here, the absolute value of the second level is the same as the absolute value of the current (isource) due to the source current 611, and the absolute value of the first level is as small as the absolute value of the current (icontrol) based on the control current 621 in the absolute value of the second level.

Referring to FIGS. 6 to 8, the turn-off section of the switching element 630 may include a first turn-off section (Toff1a, Toff1b) in which two current paths are formed between the sync current 612 and the gate terminal G, and between the control current 621 and the gate terminal G, and a second turn-off section (Toff2a, Toff2b) in which a current path is formed only between the sink current 612 and the gate terminal G.

When the switching element 630 is turned off, the gate driving signal may have a constant third current level due to the sync current 612 and the control current 621, and then have a fourth current level higher than the third current level while the current path of the control current 621 is blocked.

That is, in the first turn-off section (Toff1a, Toff1b), the sync current 612 and the control current 621 operate, and the current (isink) due to the sync current 612 and the current (icontrol) based on the control current 621 are summed.

Accordingly, the gate current ig in the first turn-off section (Toff1a, Toff1b) has a third level lower than the second turn-off section (Toff2a, Toff2b) in which the gate current ig is formed only by the current (isink) due to the sink current 612 having a constant current of a fourth level. Here, the absolute value of the fourth level is the same as the absolute value of the fourth level of the current (isource) due to the sink current 612, and the absolute value of the third level is as small as the absolute value of the current (icontrol) due to the control current 611 in the absolute value of the fourth level.

Meanwhile, the switching element such as MOSFET or IGBT inevitably causes switching losses when turned on/off.

Figure 9:
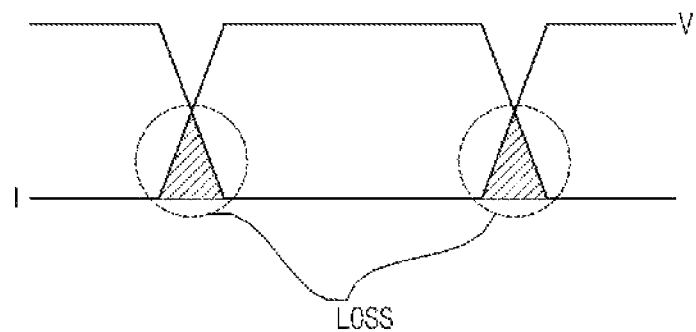
FIG. 9 is a diagram for explaining switching loss and heat generation.

FIG. 9 is a diagram for explaining switching loss and heat generation.

Referring to FIG. 9, when the switching element is turned on/off, voltage and current should ideally rise and fall vertically without a delay time to prevent loss, but voltage/current inevitably crosses and switching loss occurs as much as the voltage/current crossing area, and thus heat generation increases.

Therefore, during the switching operation, as the slew rate of the voltage and current is increased steeply, the switching time becomes faster and the switching loss and heat generation may be reduced.

However, in order to increase the rise or fall time of voltage or current, the switching loss may be reduced as a larger voltage or current is supplied to the gate terminal G. However, there is a problem of increasing the peak of the voltage or current, increasing the transient phenomenon, and increasing the stress on a circuit element.

Accordingly, embodiments of the present disclosure may reduce the transient phenomenon and the stress on the circuit element while reducing the switching loss and the heat generation, by adjusting the level of the gate current ig during the switching operation.

For example, when a large amount of gate current ig is injected into the gate terminal G during the turn-on operation, Vds may decrease steeply, and when a large amount of the gate current ig is subtracted from the gate terminal G during the turn-off operation, Vds may increase steeply. Accordingly, switching loss and heat generation may be reduced by minimizing the crossing portion of current and voltage.

In addition, according to embodiments of the present disclosure, during the turn-on/off operation, the current of the gate terminal G may be subtracted to the control current 621 in some section.

For example, the power converting apparatus 600 and the vehicle 100 including the same according to embodiments of the present disclosure may, during the turn-on operation, minimize Id peak, by using the gate current ig of a relatively low first level, by subtracting the current of the gate terminal G to the control current 621 in the Ids current rising section. Thereafter, the power converting apparatus 600 and the vehicle 100 including the same according to embodiments of the present disclosure may minimize switching loss by increasing the gate current ig up to a second level. Accordingly, it is possible to increase the efficiency of the power converting apparatus 600.

The power converting apparatus 600 and the vehicle 100 including the same according to the embodiments of the present disclosure may, during the turn-off operation, may minimize switching loss, by using the gate current ig of a relatively low third level, by subtracting the current of the gate terminal G more quickly to the control current 621. Thereafter, the power converting apparatus 600 and the vehicle 100 including the same according to embodiments of the present disclosure may increase the gate current ig up to a fourth level to limit the overshooting and peak of Vds. That is, the voltage peak may be limited while minimizing loss by increasing the absolute value of the initial gate current during the turn-off operation. Accordingly, it is possible to increase the efficiency of the power converting apparatus 600.

The power converting apparatus 600 according to an embodiment of the present disclosure may simultaneously control the turn-on/off of a semiconductor switching element by a single circuit of the gate current controller 620, so that the circuit configuration is simple and the number of components is small.

According to embodiments of the present disclosure may increase the efficiency of the power converting apparatus and reduce the size and cost, by solving the problem of the use of a high-rated switching element and the burden of a large heat dissipation design due to a trade-off between the power loss and the current/voltage peak generated during the turn-on/turn-off switching operation.

In addition, according to an embodiment of the present disclosure, since there is no separate feedback control in the gate drive unit 510, a miniaturized high-efficiency gate driver may be implemented at a lower cost.

The power converting apparatus 600 according to an embodiment of the present disclosure may easily adjust the level of the gate current ig without a large increase in the number of components by using the control current 621, and may reduce the stress of the circuit element while reducing switching loss and heat generation. Accordingly, it is possible to miniaturize and modularize the inverter and the gate driver. In particular, due to the reduction of switching loss and heat generation, the size of component, such as a heat sink, for inverter and gate driver can be reduced, which is more advantageous for miniaturization and modularization.

The power converting apparatus 600 according to an embodiment of the present disclosure and the vehicle 100 including the same may include a control current 621 for sinking current from the gate terminal G during the turn-on section and the turn-off section of the switching element 630.

During the turn-on operation, the control current 621 operates to limit the gate current ig, thereby mitigating the peak of Id and reducing element stress.

In addition, when the switching element 630 starts to be turned on, Id passes the peak point, and at the same time, Vds falls. At this time, in order to minimize the loss by shortening the time of the falling Vds, the current sinking of the control current 621 is stopped, thereby improving the switching speed by increasing the gate current ig.

During the turn-off operation, the capacitance component C may be discharged with an initial large gate current ig, and when the gate voltage falls below a certain level, the switching element 630 starts to be turned off and Vds starts to rise. At this time, since the gate current ig is kept large, the rising slope of Vds is rapid, and thus switching loss is reduced.

After the rising of Vds is achieved to some extent, current sinking of the control current 621 is stopped, thereby suppressing the increase in the Vds peak by lowering the absolute value of the gate current ig. This can reduce element stress.

Accordingly, switching loss and heat generation may be reduced at low cost, and miniaturization and modularization of inverter and gate driver may be achieved.

The power converting apparatus 600 and the vehicle 100 including the same according to an embodiment of the present disclosure may further include an inverter 420 that outputs AC power to the motor 250, and an inverter controller 430 that outputs an inverter switching control signal Sic to the gate drive unit 510 so as to control the switching operation of the inverter 420. In this case, the switching element 630 driven by the gate drive unit 510 may be any one of a plurality of switching elements in the inverter 420.

In addition, the power converting apparatus 600 and the vehicle 100 including the same according to an embodiment of the present disclosure may further include a DC terminal capacitor C that stores a voltage Vdc of the DC terminal that is an input terminal of the inverter 420, and a DC terminal voltage detector B configured to detect the DC terminal voltage Vdc.

According to an embodiment of the present disclosure, the detected DC terminal voltage Vdc may be transmitted to the control current controller 622, and the operating section of the control current 621 may be varied based on the detected DC terminal voltage Vdc.

That is, in determining the current level of the gate current ig applied during the switching operation, in addition to the existing PWM signal, DC terminal voltage Vdc information is additionally used, thereby determining a time (P1, P2, P3, P4) during which the current (icontrol) based on the control current 621 flows by comparing the magnitudes of the Vdc voltage and the set voltage value Vth.

For example, when the switching element 630 is turned on, the control current 621 may operate longer in the case where the detected DC terminal voltage Vdc is greater than a preset reference voltage Vth, in comparison with the case where the detected DC terminal voltage Vdc is less than the preset reference voltage Vth.

In addition, when the switching element 630 is turned off, the control current 621 may operate shorter in the case where the detected DC terminal voltage Vdc is greater than a preset reference voltage Vth, in comparison with the case where the detected DC terminal voltage Vdc is less than the preset reference voltage Vth.

FIG. 7 may be a gate current waveform when the detected DC terminal voltage Vdc is greater than or equal to a preset reference voltage Vth, and FIG. 8 may be a gate current waveform when the detected DC terminal voltage Vdc is less than a preset reference voltage Vth.

Referring to FIG. 7 and FIG. 8, when the switching element 630 is turned on, the operation section length P1 of the control current 621 when the detected DC terminal voltage Vdc is greater than a preset reference voltage Vth is longer than the operation section length P3 of the control current 621 when the detected DC terminal voltage Vdc is less than a preset reference voltage Vth.

When the detected DC terminal voltage Vdc is greater than or equal to a preset reference voltage Vth, the voltage may be considered to be high. Thus, peak limit may be prioritized. When the switching element 630 is turned on, the control current 621 may be operated longer. Accordingly, the initial gate current ig is limited, thereby improving circuit reliability.

In addition, when the detected DC terminal voltage Vdc is less than a preset reference voltage Vth, the voltage may be considered to be low. Thus, switching may be prioritized. When the switching element 630 is turned on, the control current 621 may be operated shorter. Accordingly, more gate current ig is supplied, thereby improving switching efficiency.

Referring to FIG. 7 and FIG. 8, when the switching element 630 is turned off, the operation section length P2 of the control current 621 when the detected DC terminal voltage Vdc is greater than a preset reference voltage Vth is shorter than the operation section length P4 of the control current 621 when the detected DC terminal voltage Vdc is less than a preset reference voltage Vth.

When the detected DC terminal voltage Vdc is greater than or equal to a preset reference voltage Vth, the voltage may be considered to be high. Thus, peak limit may be prioritized. When the switching element 630 is turned off, the control current 621 may be operated shorter. Accordingly, the initial gate current ig is limited, thereby improving circuit reliability.

In addition, when the detected DC terminal voltage Vdc is less than a preset reference voltage Vth, the voltage may be considered to be low. Thus, switching may be prioritized. When the switching element 630 is turned on, the control current 621 may be operated longer. Accordingly, the gate current ig is more drained from the gate terminal G, thereby improving switching efficiency.

The power converting apparatus 600 and the vehicle 100 including the same according to an embodiment of the present disclosure may perform switching operation control by configuring the magnitude of the gate current ig into two levels in turn-on and turn-off by using three current sources 611, 612, and 621.

Here, the source current 611 and the sink current 612 may be a current source having a constant current level.

Figure 10:
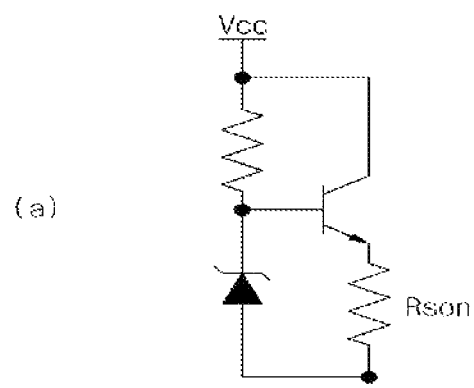
FIG. 10 is a diagram illustrating a current source unit according to an embodiment of the present disclosure.
Figure 10:
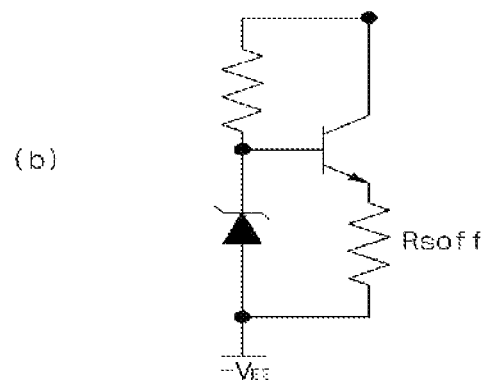

FIG. 10 is a diagram illustrating a current source unit 610 according to an embodiment of the present disclosure. FIG. 10A illustrates an example of the source current 611, and FIG. 10B illustrates an example of the sync current 612.

Referring to FIGS. 10A and 10B, the source current 611 and the sink current 612 may be implemented by a constant current source circuit composed of a resistor and a Zener diode.

FIGS. 10A and 10B are exemplary, and the present disclosure is not limited thereto.

Figure 11:
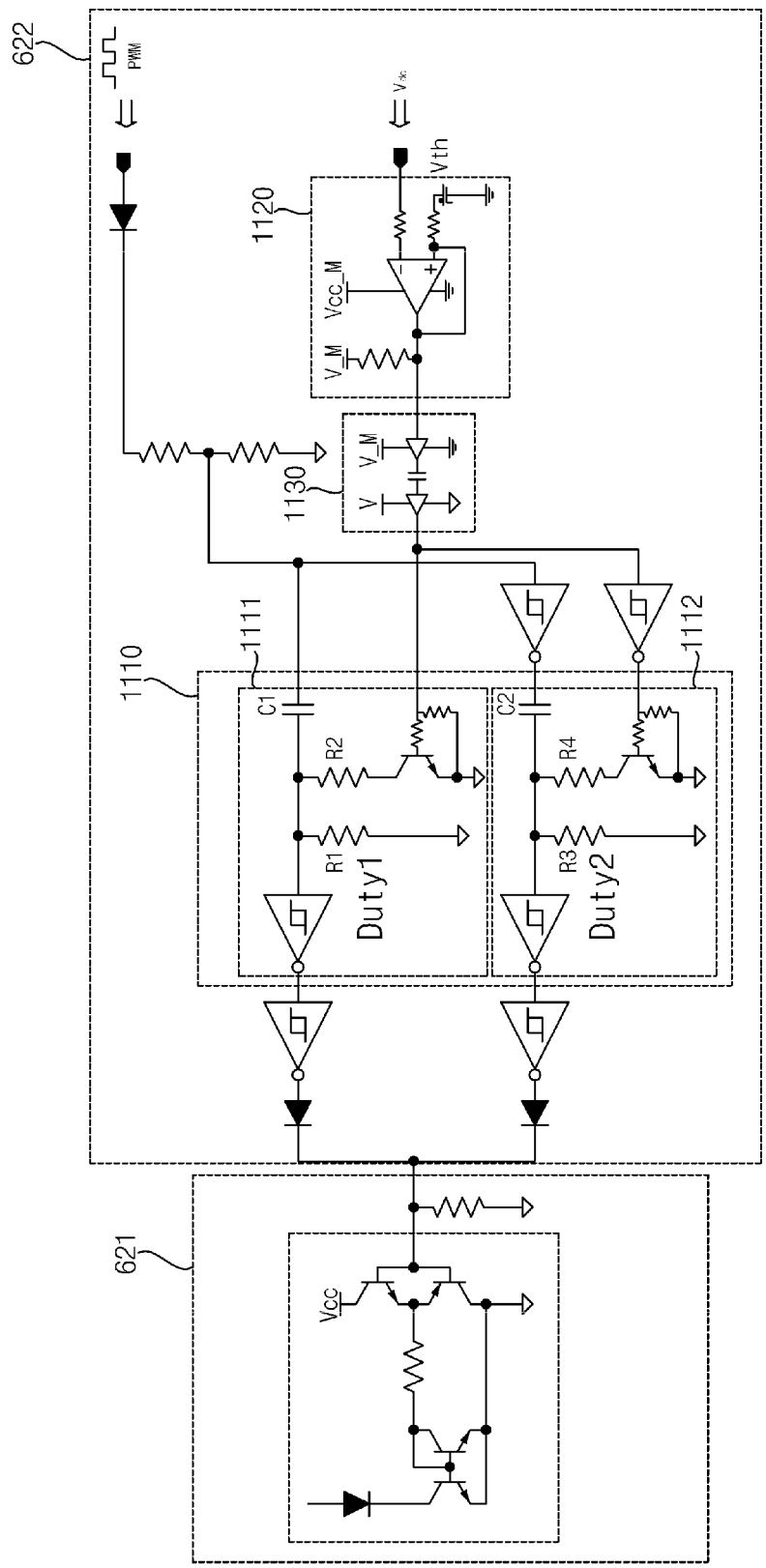
FIG. 11 is a diagram illustrating a control current and a control current controller according to an embodiment of the present disclosure.

FIG. 11 is a diagram illustrating a control current and a control current controller according to an embodiment of the present disclosure.

Referring to FIG. 11, the control current 621 may be a voltage controlled current source (VCCS). In this case, the control current controller 622 may be configured by a circuit capable of controlling the voltage controlled current source (VCCS).

Referring to FIG. 11, the control current controller 622 may include a duty unit 1110 that determines a duty of the control current 621. According to an embodiment, the duty unit 1110 for determining a duty may include a plurality of duty units 1111 and 1112. In this case, any one of the plurality of duty units 1111 and 1112 may be selected based on the detected DC terminal voltage Vdc. Accordingly, the duty of the control current 621 may be determined by comparing the detected DC terminal voltage Vdc with a preset reference voltage Vth.

Meanwhile, the control current controller 622 may include a comparator 1120 configured to compare the detected DC terminal voltage Vdc with the reference voltage Vth, a turn-on duty unit 1111 outputting a control signal to the control current 621, when the switching element 630 is turned on, and a turn-off duty unit 1112 that outputs a control signal to the control current 621, when the switching element 630 is turned off.

Here, the turn-on duty unit 1111 and the turn-off duty unit 1112 may include a switching element that is turned on to have a different time constant according to the detected DC terminal voltage Vdc.

Figure 12A:
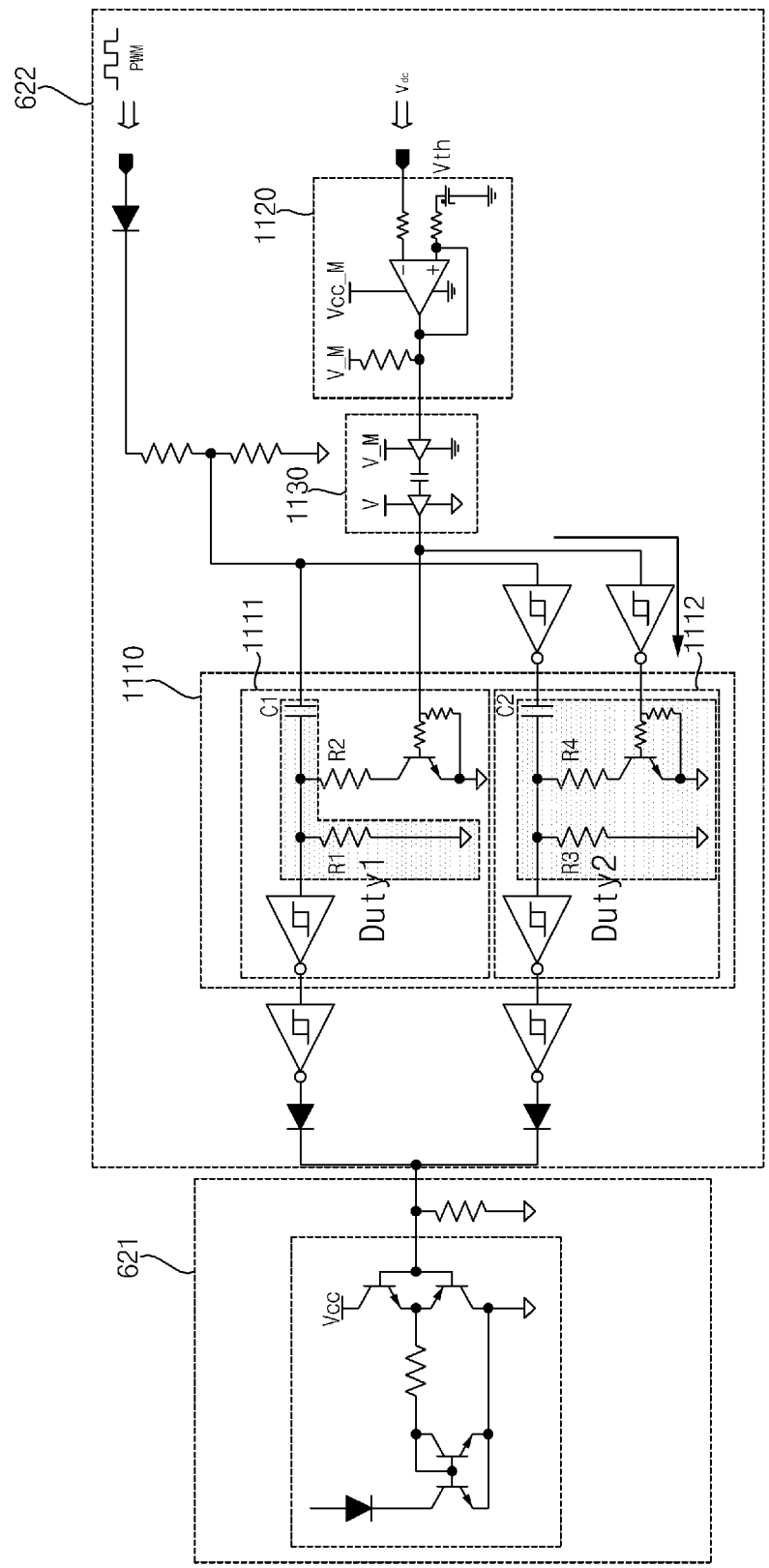
FIGS. 12A and 12B are diagrams for explaining a control current and an operation of a control current controller according to an embodiment of the present disclosure.
Figure 12B:
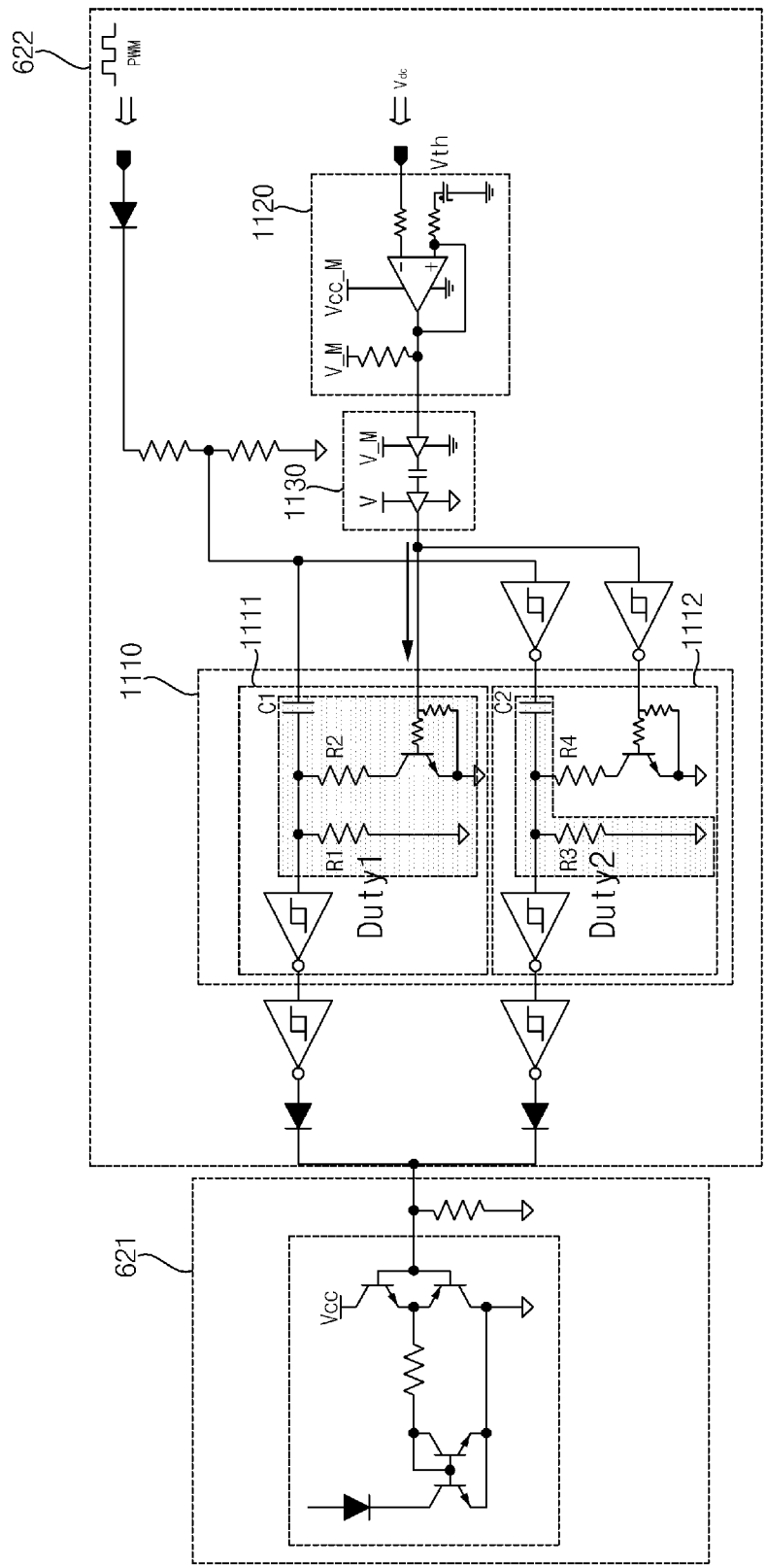

FIGS. 12A and 12B are diagrams for explaining a control current and an operation of a control current controller according to an embodiment of the present disclosure.

FIG. 12A illustrates a case where the DC terminal voltage Vdc>reference voltage Vth, and FIG. 12B illustrates a case where the DC terminal voltage Vdc<reference voltage Vth.

Referring to FIG. 12A, during a turn-on operation, the switching element of the turn-on duty unit 1111 is turned off to select R1&C1, and during a turn-off operation, the switching element of the turn-off duty unit 1112 is turned on to select R3//R4&C2.

Referring to FIG. 12B, during a turn-on operation, the switching element of the turn-on duty unit 1111 is turned on to select R1//R2&C1, and during a turn-off operation, the switching element of the turn-off duty unit 1112 is turned off to select R3&C2.

In some embodiments, the control current controller 622 may further include an insulating unit 1130 which is disposed between the comparator 1120, and the turn-on duty unit 1111 and the turn-off duty unit 1112, and insulates an external power V_M.

According to an embodiment of the present disclosure, switching loss may be reduced while limiting the current/voltage peak (current peak Ipeak in turn-on, voltage peak Vpeak in turn-off) generated when switching a semiconductor switching element (Si-IGBT, Si-MOSFET, SiC-MOSFET, etc.). Since heat generation is also reduced by reducing switching loss, the volume of the heat dissipation unit may be reduced.

In addition, according to an embodiment of the present disclosure, since a single gate current controller 620 may be used in common during turn-on and turn-off, the power converting apparatus 600 may be more easily modularized and miniaturized.

Further, according to an embodiment of the present disclosure, the detected DC terminal voltage Vdc may be transmitted to the control current controller 622, the operation section of the control current 621 may vary based on the detected DC terminal voltage Vdc.

That is, in determining the current level of the gate current ig applied during the switching operation, the time (P1, P2, P3, and P4) through which the current (icontrol) based on the control current 621 flows may be determined by comparing the magnitudes of the Vdc voltage and the set voltage value Vth, by using the DC terminal voltage Vdc information in addition to the existing PWM signal.

Figure 13A:
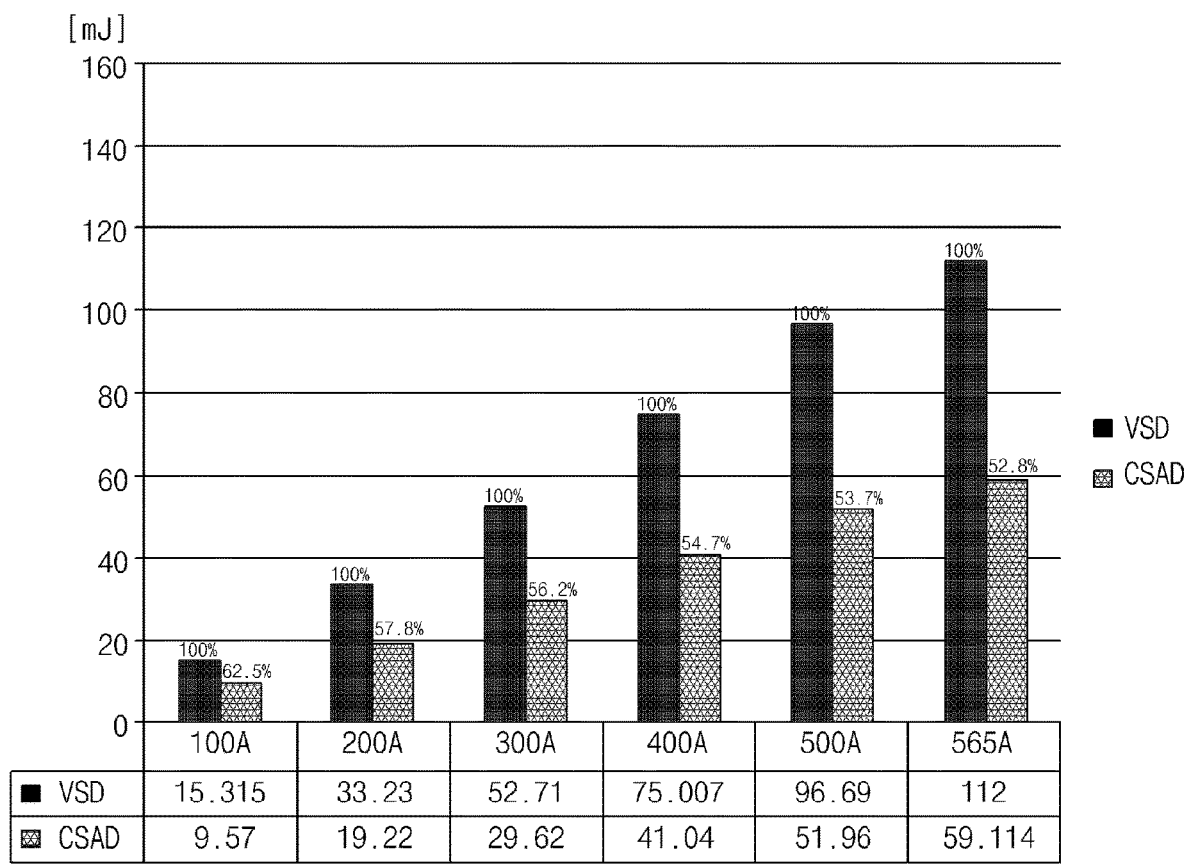
FIGS. 13A and 13B are diagrams for explaining a loss reduction effect during a switching operation according to an embodiment of the present disclosure.
Figure 13B:
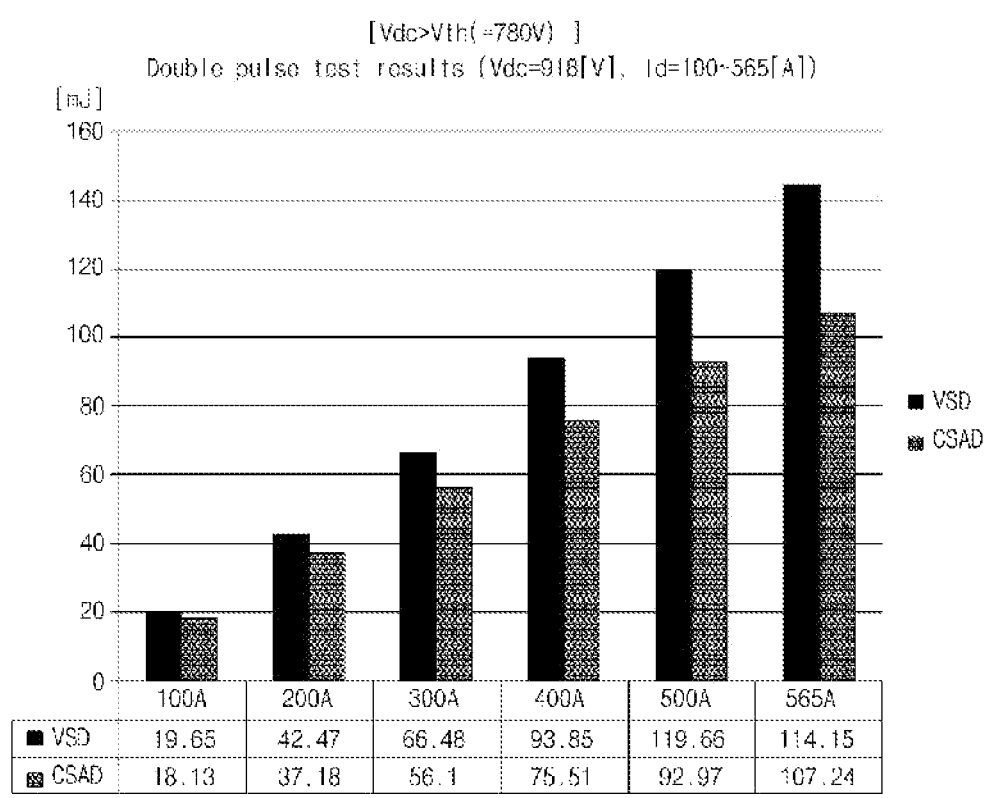

FIGS. 13A and 13B are diagrams for explaining a loss reduction effect during a switching operation according to an embodiment of the present disclosure.

FIGS. 13A and 13B are the sum of the turn-on/off switching losses when an embodiment (CSAD) of the present disclosure is applied, in comparison with to a conventional switching method (VSD) of a voltage type switching semiconductor device.

FIG. 13A illustrates a case where the DC terminal voltage Vdc<reference voltage Vth, and FIG. 12B illustrates a case where the DC terminal voltage Vdc>reference voltage Vth.

Referring to FIGS. 13A and 13B, it can be seen that switching loss is reduced according to an embodiment of the present disclosure. According to an embodiment of the present disclosure, it is possible to increase the efficiency of the power converting apparatus and reduce the size and cost by solving the problem of increasing the burden on heat dissipation design.

In addition, as shown in FIG. 13A, when the DC terminal voltage Vdc is less than the reference voltage Vth, the gate current ig may be further injected or subtracted, thereby further reducing the switching loss.

Figure 14:
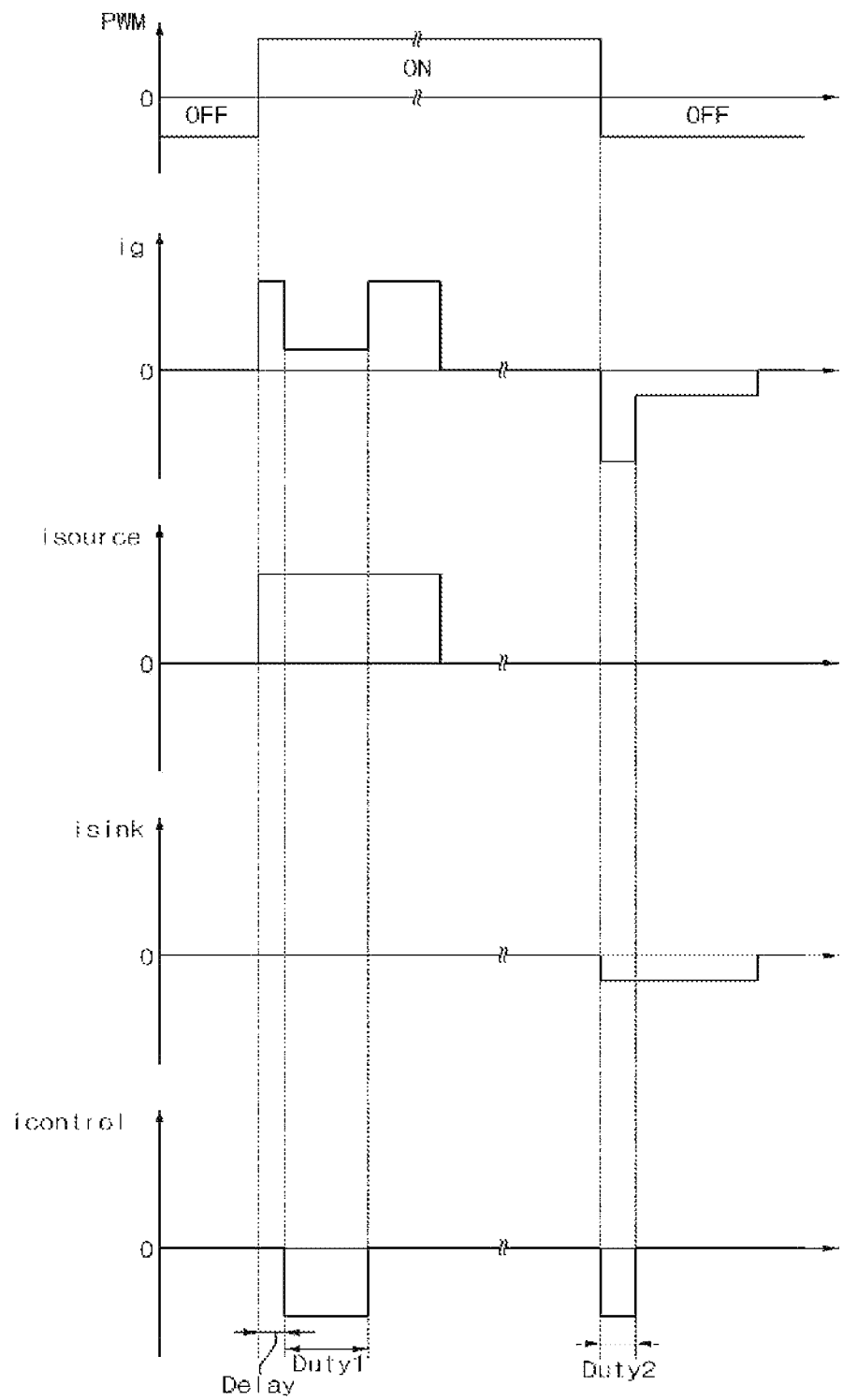
FIG. 14 is a diagram for explaining a gate driving signal of a power converting apparatus according to an embodiment of the present disclosure.

FIG. 14 is a diagram for explaining a gate driving signal of a power converting apparatus according to an embodiment of the present disclosure.

Figure 15:
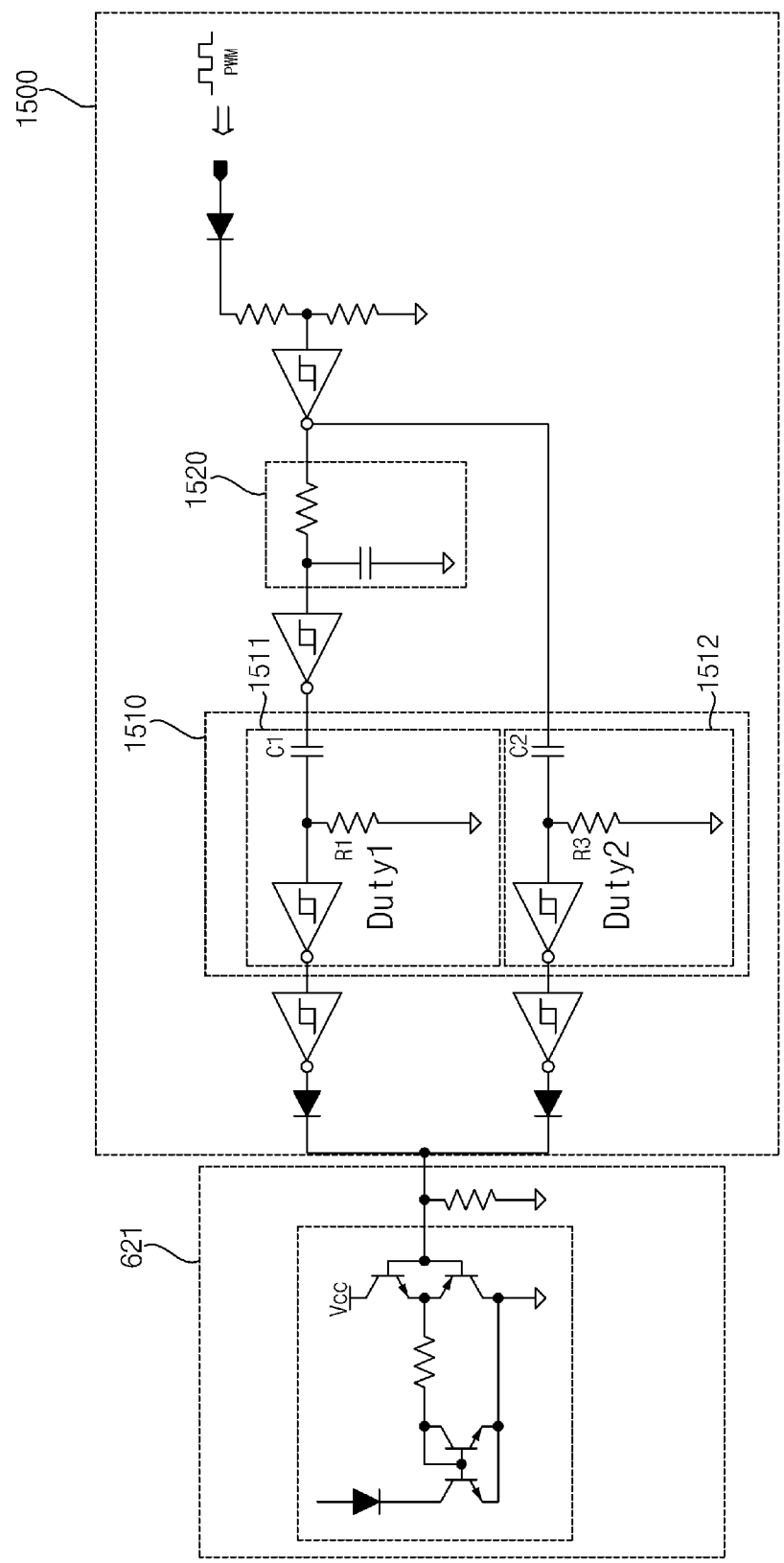
FIG. 15 is a diagram illustrating a control current and a control current controller according to an embodiment of the present disclosure.
Figure 16:
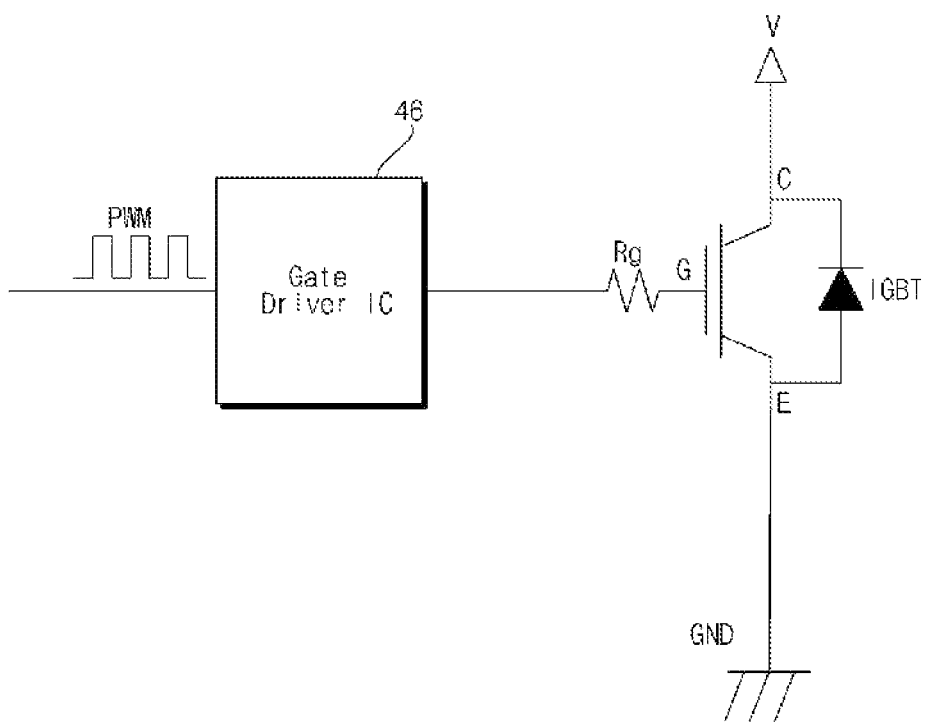
FIG. 16 illustrates a conventional insulated gate bipolar transistor (IGBT) driving circuit.

FIG. 15 is a diagram illustrating a control current and a control current controller according to an embodiment of the present disclosure, and illustrates a control current controller generating a gate driving signal of FIG. 14.

In the turn-on section of the switching element 630, a gate current ig may be generated by a combination of a current (isource) due to the source current 611 and a current (icontrol) based on the control current 621.

In addition, in the turn-off section of the switching element 630, a gate current ig may be generated by a combination of a current (isink) due to the sink current 612 and a current (icontrol) based on the control current 621.

Referring to FIGS. 14 and 15, the control current 621 operates in the operation section (Duty1, Duty2) of the control current 621 so that the current (icontrol) based on the control current 621 lowers the gate current ig.

Accordingly, it is possible to reduce the switching loss by sufficiently supplying the gate current while improving the circuit reliability by limiting the peak of voltage/current.

Referring to FIG. 15, the control current 621 may be a voltage controlled current source VCCS. In this case, the control current controller 1500 may be configured of a circuit capable of controlling the voltage controlled current source VCCS.

Referring to FIG. 15, the control current controller 1500 may include a duty unit 1510 that determines a duty of the control current 621. In some embodiments, the duty unit 1510 for determining a duty may include a plurality of duty units 1511 and 1512.

Meanwhile, when the switching element 630 is turned on, the duty unit 1510 may include a turn-on duty unit 1511 that outputs a control signal to the control current 621, and a turn-off duty unit 1512 that outputs a control signal to the control current 621, when the switching element 630 is turned off.

Meanwhile, referring to FIG. 15, the control current controller 1500 may further include a delay unit 1520 configured to delay the operation of the control current 621 for a certain time when the switching element 630 is turned on.

In the section in which the operation of the control current 621 is delayed for a certain time, the gate voltage is increased as the gate current ig enters the switching element 630, and the turn-on is not yet performed, but the initial gate capacitance component C may be charged with a large current. In addition, when the gate voltage becomes higher than a certain level and the switch conduction starts, the current Id between the drain and source starts to rise, and the voltage Vds between the drain and source drops due to leakage inductance. At this time, since the gate current ig is kept large, the rising slope of Id is rapid, and there exists a loss reduction effect.

By operating the control current 621 in the middle of a time when the current rises, the gate current ig is rapidly reduced and the slope of Id is loosened. Therefore, the effect of mitigating the peak of Id may occur and element stress may be reduced.

When the switching element 630 starts to be turned on, Id passes the peak point, and at the same time, Vds falls. In this case, in order to minimize the loss by shortening the time of the falling Vds, the current sinking of the control current 621 is stopped, thereby improving the switching speed by increasing the gate current ig.

During the turn-off operation, the capacitance component C may be discharged with an initial large gate current ig, and when the gate voltage falls below a certain level, the switching element 630 starts to be turned off and Vds starts to rise. At this time, since the gate current ig is kept large, the rising slope of Vds is rapid, and thus switching loss is reduced.

After the rising of Vds is achieved to some extent, the current sinking of the control current 621 is stopped, thereby suppressing the rising of the Vds peak by rapidly lowering the gate current ig. This can reduce element stress.

The power converting apparatus and the vehicle including the same according to the present disclosure are not limited to the configuration and method of the embodiments described above, but all or some of the embodiments may be selectively combined and configured so that various modifications of the embodiments are achieved.

Meanwhile, it is possible to implement the present disclosure as a code that can be read by a processor in a recording medium that can be read by a processor provided in the power converting apparatus and the vehicle including the same according to the present disclosure. The processor-readable recording medium includes all types of recording devices that store data that can be read by the processor.

The power converting apparatus and a vehicle including the same according to an embodiment of the present disclosure may reduce the stress of the circuit element while reducing switching loss and heat generation by using a control current that sinks current from the gate terminal during a partial section of the turn-on section and the turn-off section of the current sources connected to the gate terminal of the switching element and the switching element.

The power converting apparatus and the vehicle including the same according to an embodiment of the present disclosure include a control current for sinking current from the gate terminal during a partial section of the turn-on section and the turn-off section of the switching element, so that switching loss and heat generation can be reduced at low cost, and inverter and gate driver can be miniaturized and modularized.

A power converting apparatus and a vehicle including the same according to an embodiment of the present disclosure includes a switching element; and a gate drive unit configured to apply a gate driving signal for driving the switching element to a gate terminal of the switching element, wherein the gate drive unit includes: a current source unit including a source current for sourcing current to the gate terminal in a turn-on section of the switching element, and a sink current for sinking current from the gate terminal in a turn-off section of the switching element; a control current for sinking the current from the gate terminal during a partial section of the turn-on section and the turn-off section of the switching element; and a control current controller configured to control an operation of the control current. Accordingly, switching loss and heat generation can be reduced at low cost, and miniaturization and modularization of inverter and gate driver can be achieved.

According to at least one of the embodiments of the present disclosure, switching loss and heat generation can be reduced.

In addition, according to at least one of the embodiments of the present disclosure, it is possible to reduce element stress by limiting overvoltage and overcurrent that may occur during a switching operation.

Further, according to at least one of the embodiments of the present disclosure, by using a small number of components, it is possible to provide a low-cost, high-efficiency power converting apparatus, and a vehicle including the same.

In addition, according to at least one of the embodiments of the present disclosure, by using a small number of components, it is possible to provide a power converting apparatus that is easy to miniaturize and modularize, and a vehicle including the same.

In addition, according to at least one of the embodiments of the present disclosure, switching efficiency may be further improved through a switching operation according to a situation.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A power converting apparatus comprising:
    a switching element; and
    a gate drive configured to apply a gate driving signal to a gate terminal of the switching element,
    wherein the gate driving signal drives the switching element, and
    wherein the gate drive comprises:
    a current source including a source current for sourcing current to the gate terminal in a turn-on section of the switching element, and a sink current for sinking current from the gate terminal in a turn-off section of the switching element;
    a control current for sinking the current from the gate terminal during a partial section of the turn-on section and during a partial section of the turn-off section of the switching element; and
    a control current controller configured to control an operation of the control current.

2. The power converting apparatus of claim 1, wherein the gate driving signal is a combination of a current based on the current source and a current based on the control current.

3. The power converting apparatus of claim 1, wherein the turn-on section of the switching element comprises a first turn-on section in which two current paths are formed between the source current and the gate terminal and between the control current and the gate terminal, and a second turn-on section in which one current path is formed only between the source current and the gate terminal.

4. The power converting apparatus of claim 1, wherein the turn-off section of the switching element comprises a first turn-off section in which two current paths are formed between the control current and the gate terminal and a second turn-off section in which one current path is formed only between the sink current and the gate terminal.

5. The power converting apparatus of claim 1, wherein the gate driving signal is a gate current having at least two levels.

6. The power converting apparatus of claim 1, wherein, when the switching element is turned on, the gate driving signal first has a constant first current level due to the source current and the control current, followed by a second current level higher than the first current level while a current path of the control current is blocked.

7. The power converting apparatus of claim 1, wherein, when the switching element is turned off, the gate driving signal first has a constant third current level due to the sink current and the control current, followed by a fourth current level higher than the third current level while a current path of the control current is blocked.

8. The power converting apparatus of claim 1, further comprising:
    an inverter to output AC power to a motor; and
    an inverter controller configured to output an inverter switching control signal to the gate drive so as to control switching operations of the inverter,
    wherein the switching element is any one of a plurality of switching elements in the inverter.

9. The power converting apparatus of claim 8, further comprising:
    a DC terminal capacitor to store a voltage of an input terminal, DC terminal, of the inverter; and
    a DC terminal voltage detector to detect the voltage of the DC terminal,
    wherein an operation section of the control current is varied based on the detected voltage of the DC terminal.

10. The power converting apparatus of claim 9, wherein, when the switching element is turned on, the control current operates for a longer time period when the detected voltage of the DC terminal is greater than a preset reference voltage, than when the detected voltage of the DC terminal is less than the preset reference voltage.

11. The power converting apparatus of claim 9, wherein, when the switching element is turned off, the control current operates for a shorter time period when the detected voltage of the DC terminal is greater than a preset reference voltage, than when the detected voltage of the DC terminal is less than the preset reference voltage.

12. The power converting apparatus of claim 9, wherein the control current controller comprises a plurality of duty units, and any one of a plurality of duty units is selected based on the detected voltage of the DC terminal.

13. The power converting apparatus of claim 9, wherein the control current controller comprises:
    a comparator to compare the detected voltage of the DC terminal with the preset reference voltage;
    a turn-on duty unit to output a first control signal to the control current, when the switching element is turned on; and
    a turn-off duty unit to output a second control signal to the control current, when the switching element is turned off.

14. The power converting apparatus of claim 13, wherein the turn-on duty unit and the turn-off duty unit comprise a switching element that is turned on to have a different time constant according to the detected voltage of the DC terminal.

15. The power converting apparatus of claim 13, wherein the control current controller further comprises an insulating unit which is disposed between the comparator, the turn-on duty unit, and the turn-off duty unit.

16. The power converting apparatus of claim 1, wherein the source current and the sink current are a source of current having a constant current level magnitude.

17. The power converting apparatus of claim 1, wherein the control current is a voltage controlled current source.

18. A vehicle comprising:
a switching element; and
a power converting apparatus including a gate drive configured to apply a gate driving signal to a gate terminal of the switching element,
wherein the gate driving signal drives the switching element, and
wherein the gate drive comprises:
a current source including a source current for sourcing current to the gate terminal in a turn-on section of the switching element, and a sink current for sinking current from the gate terminal in a turn-off section of the switching element;
a control current for sinking the current from the gate terminal during a partial section of the turn-on section and during a partial section of the turn-off section of the switching element; and
a control current controller configured to control an operation of the control current.

19. The vehicle of claim 18, wherein the turn-on section of the switching element comprises a first turn-on section in which two current paths are formed between the source current and the gate terminal and between the control current and the gate terminal, and a second turn-on section in which one current path is formed only between the source current and the gate terminal, and
the turn-off section of the switching element comprises a first turn-off section in which two current paths are formed between the control current and the gate terminal, and a second turn-off section in which one current path is formed only between the sink current and the gate terminal.

20. The vehicle of claim 18, wherein, when the switching element is turned on, the gate driving signal first has a constant first current level due to the source current and the control current, followed by a second current level higher than the first current level while a current path of the control current is blocked, and
when the switching element is turned off, the gate driving signal has a constant third current level due to the sink current and the control current, followed by a fourth current level higher than the third current level while a current path of the control current is blocked.

* * * * *